United States Patent
Akae et al.

(10) Patent No.: US 8,415,258 B2
(45) Date of Patent: *Apr. 9, 2013

(54) METHOD OF MANUFACTURING SEMICONDUCTOR DEVICE, METHOD OF PROCESSING SUBSTRATE AND SUBSTRATE PROCESSING APPARATUS

(75) Inventors: Naonori Akae, Toyama (JP); Yoshiro Hirose, Toyama (JP); Yushin Takasawa, Toyama (JP); Yosuke Ota, Toyama (JP); Ryota Sasajima, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/286,314

(22) Filed: Nov. 1, 2011

(65) Prior Publication Data

US 2012/0045905 A1 Feb. 23, 2012

Related U.S. Application Data

(63) Continuation of application No. 12/893,311, filed on Sep. 29, 2010, now Pat. No. 8,076,251.

(30) Foreign Application Priority Data

Sep. 30, 2009 (JP) .................................. 2009-226420
Jul. 2, 2010 (JP) .................................. 2010-152031

(51) Int. Cl.
*H01L 21/31* (2006.01)

(52) U.S. Cl. ........ 438/786; 438/787; 438/789; 438/791; 427/497; 427/509; 427/578; 118/715; 118/723 VE; 118/723 ER

(58) Field of Classification Search .......... 438/786–791; 427/509, 579, 578, 585; 118/715, 723 VE, 118/723 ER; 257/E21.274, E21.276, E21.277, 257/E21.278, E21.293
See application file for complete search history.

(56) References Cited

U.S. PATENT DOCUMENTS

| 8,076,251 B2 * | 12/2011 | Akae et al. ..................... 438/786 |
| 2009/0170345 A1 | 7/2009 | Akae et al. |
| 2011/0076857 A1 | 3/2011 | Akae et al. |

FOREIGN PATENT DOCUMENTS

| CN | 101094732 | 12/2007 |
| JP | 2002343793 | 11/2002 |
| JP | 2005310927 | 11/2005 |
| JP | 2006054432 | 2/2006 |
| JP | 2009178309 | 8/2009 |

* cited by examiner

*Primary Examiner* — Hsien Ming Lee
(74) *Attorney, Agent, or Firm* — Brundidge & Stanger, P.C.

(57) ABSTRACT

Provided is a method of manufacturing a semiconductor device. The method includes: loading a substrate into a process vessel; performing a process to form an film on the substrate by alternately repeating: (a) forming a layer containing an element on the substrate by supplying at least two types of source gases into the process vessel, each of the at least two types of source gases containing the element, and (b) changing the layer containing the element by supplying reaction gas into the process vessel, the reaction gas being different from the at least two types of source gases; and unloading the processed substrate from the process vessel.

19 Claims, 8 Drawing Sheets

| | (a)<br>DCS | (b)<br>DCS WITH SMALL<br>AMOUNT OF HCD | (c)<br>SMALL AMOUNT<br>OF HCD |
|---|---|---|---|
| SiO GROWTH RATE [a.u.] | 1.00 | 2.22 | 0.95 |
| SiO FILM THICKNESS<br>UNIFORMITY [a.u.] | 1.0 | 0.7 | 5.3 | and 2010-152031, filed on Jul. 2, 2010, in the Japanese Patent
METHOD OF MANUFACTURING SEMICONDUCTOR DEVICE, METHOD OF PROCESSING SUBSTRATE AND SUBSTRATE PROCESSING APPARATUS

CROSS-REFERENCE TO RELATED PATENT APPLICATION

The present application is a continuation of application Ser. No. 12/893,311, filed Sep. 29, 2010, now U.S. Pat. No. 8,076, 251; which claims priority under 35 U.S.C. §119 of Japanese Patent Application Nos. 2009-226420, filed on Sep. 30, 2009, and 2010-152031, filed on Jul. 2, 2010, in the Japanese Patent Office, the entire contents of which are hereby incorporated by reference.

BACKGROUND OF THE INVENTION

1. Field of the Invention

The present invention relates to a method of manufacturing a semiconductor device, a method of processing a substrate and a substrate processing apparatus.

2. Description of the Related Art

A flash memory includes an electron accumulation region (floating gate) surrounded by an insulating film and operates in a manner such that information is written in the flash memory by exchanging electrons through a thin tunnel oxide film and the stored information is retained for a long time by holding electrons using the insulating capacity of the thin tunnel oxide layer. Such a flash memory is required to retain the stored information for a long time, for example, even 10 years, without requiring any external operation, and thus stricter requirements are imposed on an insulating film surrounding a charge accumulation region which is called a floating gate. A stacked structure of oxide film ($SiO_2$)/nitride film ($Si_3N_4$)/oxide film ($SiO_2$), which is generally called "ONO" structure, is used as an interlayer insulating film between a floating gate and a control gate configured to control the operation of a memory cell, and it is expected that the ONO structure has high leak current characteristics.

In a conventional art, $SiO_2$ insulating films of an ONO stacked structure are formed at a high temperature close to 800° C. by a chemical vapor deposition (CVD) method, for example, using $SiH_2Cl_2$ gas and $N_2O$ gas. However, as the structure of a device becomes finer, the capacitance of a nitride film of an ONO stacked film is decreased, and thus the use of a high dielectric constant film instead of a nitride film is considered to guarantee capacitance. A $SiO_2$ insulating film on a high dielectric constant film is required to be formed at a temperature lower than a temperature at which the high dielectric constant film is formed so as to prevent crystallization of the high dielectric constant film.

[Patent Document 1] Japanese Patent Application No. 2009-178309

When a $SiO_2$ insulating film is formed, if the film-forming temperature is low, the growth rate of the film (film-forming rate) tends to decrease. Therefore, inorganic or organic sources which are highly reactive and are easily adsorbed on a substrate are used. However, since such sources are less available and expensive as compared with conventional source materials, if semiconductor devices are formed by using such sources, the prices of the semiconductor devices may be increased. In addition, if such sources are used, it is difficult to guarantee the thickness uniformity of an insulating film.

SUMMARY OF THE INVENTION

An object of the present invention is to provide a method of manufacturing a semiconductor device, a method of processing a substrate and a substrate processing apparatus wherein an insulating film can be formed at a high growth rate even at a low temperature and the thickness of the insulating film can be uniformly maintained with low costs.

According to an aspect of the present invention, there is provided a method of manufacturing a semiconductor device, the method including:

loading a substrate into a process vessel;

performing a process to form a film on the substrate by alternately repeating:

(a) forming a layer containing an element on the substrate by supplying at least two types of source gases into the process vessel, each of the at least two types of source gases containing an element; and (b) changing the layer containing the element by supplying a reaction gas into the process vessel, the reaction gas being different from the at least two types of source gases; and unloading the processed substrate from the process vessel.

According to another aspect of the present invention, there is provided a method of manufacturing a semiconductor device, the method including:

loading a substrate into a process vessel;

performing a process to form a film on the substrate by alternately repeating:

(a) supplying at least two types of source gases into the process vessel, each of the at least two types of source gases containing an element; and (b) supplying a reaction gas into the process vessel, the reaction gas being different from the at least two types of source gases; and unloading the processed substrate from the process vessel.

According to another aspect of the present invention, there is provided a substrate processing apparatus including:

a process vessel configured to accommodate a substrate;

a source gas supply system configured to supply at least two types of source gases into the process vessel, each of the at least two types of source gases containing the element;

a reaction gas supply system configured to supply a reaction gas into the process vessel, the reaction gas being different from the at least two types of source gases; and a control unit configured to control the source gas supply system and the reaction gas supply system, so as to form film on the substrate by alternately repeating:

(a) forming a layer containing the element on the substrate by supplying the at least two types of source gases into the process vessel; and (b) changing the layer containing the element by supplying the reaction gas into the process vessel.

DETAILED DESCRIPTION OF THE PREFERRED EMBODIMENTS

In the case of dichlorosilane ($SiH_2Cl_2$, abbreviation: DCS) which is widely used as a silicon source for forming a $SiO_2$ film by a chemical vapor deposition (CVD) method, if the film-forming temperature is lowered, the reactivity of the DCS is significantly decreased, thereby increasing incubation time during which adsorption of the DCS and deposition of silicon occur on a substrate (on a surface layer of the substrate such as a $SiO_2$ film, SiON film, or SiN film). Therefore, it is very difficult to form a silicon layer constituted by less than one atomic layer to several atomic layers. In addition, at this time, the thickness uniformity of a $SiO_2$ film is very bad due to unevenness of silicon layer formation.

Figures 6, 7:
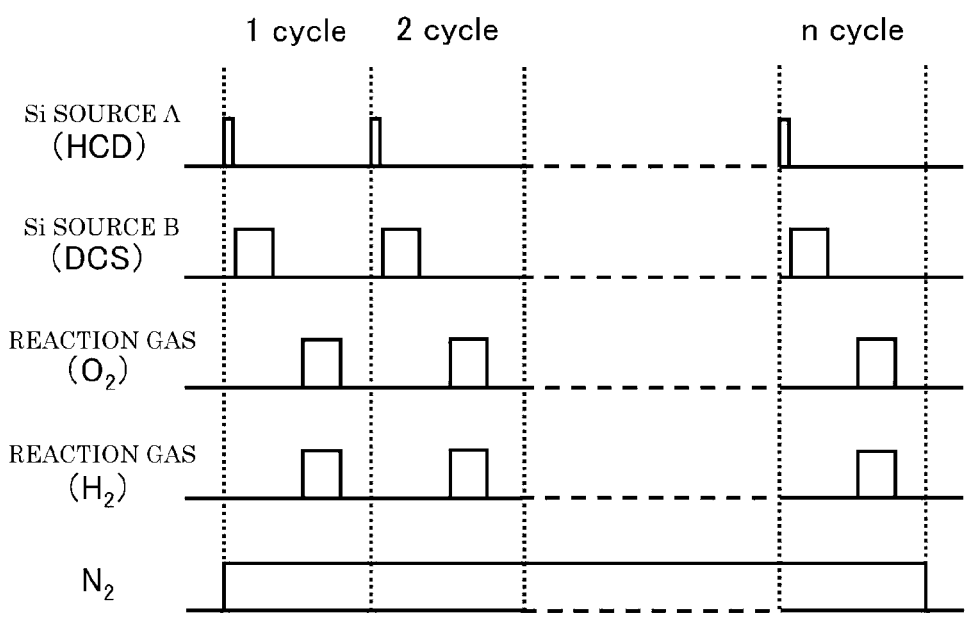
FIG. 6 illustrates exemplary gas supply timing according to a film-forming sequence of the embodiment of the present invention, in which HCD gas is supplied prior to supply of DCS gas, and after the supply of HCD gas is first stopped and then the supply of DCS gas is stopped, $O_2$ gas and $H_2$ gas are supplied.
FIG. 7 is an experimental result table showing the growth rate and thickness uniformity of a $SiO_2$ film for the case where only DCS gas was used, the case where DCS gas added with a small amount of HCD gas was used, and the case where only a small amount of HCD gas was used.

FIG. 7 is an experimental result table showing the growth rates and thickness uniformities of $SiO_2$ films formed on substrates by alternately supplying a silicon source and a reaction gas (oxygen gas and hydrogen gas) under a low temperature condition (600° C.). The column (a) of FIG. 7 shows a growth rate and thickness uniformity of $SiO_2$ films when only DCS gas was used as a silicon source. The column (b) of FIG. 7 shows a growth rate and thickness uniformity of $SiO_2$ films when DCS gas added with a small amount of hexachlorodisilane (HCD, $Si_2Cl_6$) gas was used as a silicon source. The column (c) of FIG. 7 shows a growth rate and thickness uniformity of $SiO_2$ films when only a small amount of HCD gas was used as a silicon source. In the experiment shown in FIG. 7, the flow rate of the small amount of HCD gas is shown as 0.03 when the flow rate of DCS gas is shown as 1. That is, in the experiment shown in FIG. 7, the ratio of the flow rate of HCD gas to the flow rate of DCS gas, in other words, the ratio of the flow rate of HCD gas/the flow rate of DCS gas (HCD/DCS flow rate ratio) was 0.03 (3%). Furthermore, in FIG. 7, relative film growth rates are shown when the film growth rate of the column (a) is put as 1 (reference), and relative film thickness uniformities are shown when the film thickness uniformity of the column (a) is put as 1 (reference). The film thickness uniformity denotes the degree of variations of film thickness distribution in a surface of a substrate, and a lower value of the film thickness uniformity denotes a better film thickness uniformity in a surface of a substrate.

The inventors have studied and found the following fact. If DCS gas is added with a small amount of hexachlorodisilane ($Si_2Cl_6$, abbreviation: HCD) gas which is an inorganic source more reactive than DCS gas (that is, which has a thermal decomposition temperature lower than that of DCS gas) and is adsorbed on a substrate more easily than DCS gas under the same conditions, the growth rate of a $SiO_2$ film can be increased even at a low temperature, for example, 600° C., and moreover, the thickness uniformity of the $SiO_2$ film can be improved. As shown in the column (b) of FIG. 7, by adding a small amount of HCD gas to DCS gas, the film growth rate could be increased by 2.2 times as compared with the case of using DCS gas alone. In addition, by adding a small amount of HCD gas to DCS gas, the film thickness uniformity could be largely improved as compared with the case of using DCS gas alone. When a small amount of HCD gas alone was used, the growth rate of a $SiO_2$ film was very low, and the thickness distribution uniformity of the $SiO_2$ film was also very bad as shown in column (c) of FIG. 7.

Figure 8:
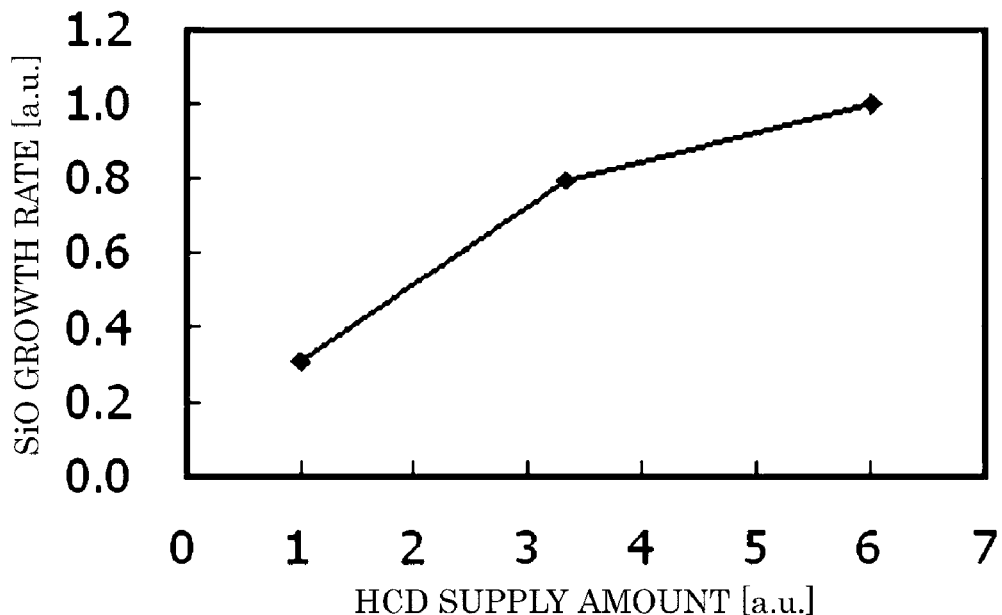
FIG. 8 is a graph showing a relationship between the supply amount of HCD gas and the growth rate of a $SiO_2$ film.

FIG. 8 is a graph showing a relationship between the growth rate of a $SiO_2$ film and the supply amount of HCD gas when the $SiO_2$ film was formed at a low temperature (600° C.) by alternately supplying HCD gas and reaction gases (oxygen gas and hydrogen gas). FIG. 8 shows a relationship between the growth rate of a $SiO_2$ film and the supply amount of HCD gas when the growth rate of the $SiO_2$ film was normalized by a certain supply amount of HCD gas. Referring to FIG. 8, as the supply amount of HCD gas decreases, the growth rate of the $SiO_2$ film decreases because adsorption of silicon on a substrate decreases. That is, when only HCD gas is used, although a small amount of HCD gas is supplied, the film growth rate is not improved. To obtain a desired film growth rate when only HCD gas is used, it is necessary to increase the supply amount of the HCD gas to a certain amount. In addition, when DCS gas is only used, the film growth rate cannot be increased at a low temperature. However, by adding a small amount of HCD gas to DCS gas, the film growth rate can be increased even at a low temperature, for example, 600° C.

By adding a small amount of HCD gas to DCS gas, the film growth rate may be increased owing to the following reason. Since adsorption of a silicon source and deposition of silicon on a substrate go on to some degree by a small amount of HCD gas supplied to the substrate, adsorption of DCS and deposition of silicon are necessary at narrower sites as compared with the case where a small amount of HCD gas is not added, and thus the narrower sites can be exposed to a relatively larger amount of DCS. Therefore, the probability of DCS adsorption and the probability of silicon deposition may be significantly increased.

In addition, owing to thermal decomposition of HCD gas supplied together with DCS gas or a reaction between H of DCS gas and Cl$_2$ generated by thermal decomposition of HCD gas, generation of SiCl$_4$ gas and Si atoms are facilitated, and thus adsorption of the silicon source and deposition of silicon are largely facilitated. By this, the film growth rate may be improved. At this time, the following reactions may occur.

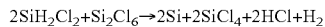

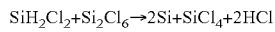

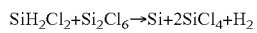

As a result, since the film growth rate can be increased and adsorption of the silicon source and deposition of silicon can be uniformly carried out, the thickness uniformity (thickness distribution) of a SiO$_2$ film may be improved according to the present invention. In addition, as compared with the case where only HCD gas is used, source material costs can be largely reduced without deteriorating the controllability of film formation.

When HCD gas used as a first silicon source gas is referred to as a Si source A and DCS gas used as a second silicon source gas is referred to as a Si source B, the Si sources A and B may be supplied according to Si source supply timing 1 shown in FIG. 4 (Si sources A and B are simultaneously supplied), Si source supply timing 2 shown in FIG. 5 (supplies of Si sources A and B are simultaneously started, and supply of Si source B is stopped later), or Si source supply timing 3 shown in FIG. 6 (supply of Si source A is first started, and supply of Si source B is stopped later). Any one of the supply timings may be used. The experimental result shown in column (b) of FIG. 7 are data obtained according to the Si source supply timing 2 of FIG. 5. The Si source supply timings will be described later in detail.

The present invention is provided based on the knowledge of the inventors. Hereinafter, an embodiment of the present invention will be described with reference to the attached drawings.

Figure 1:
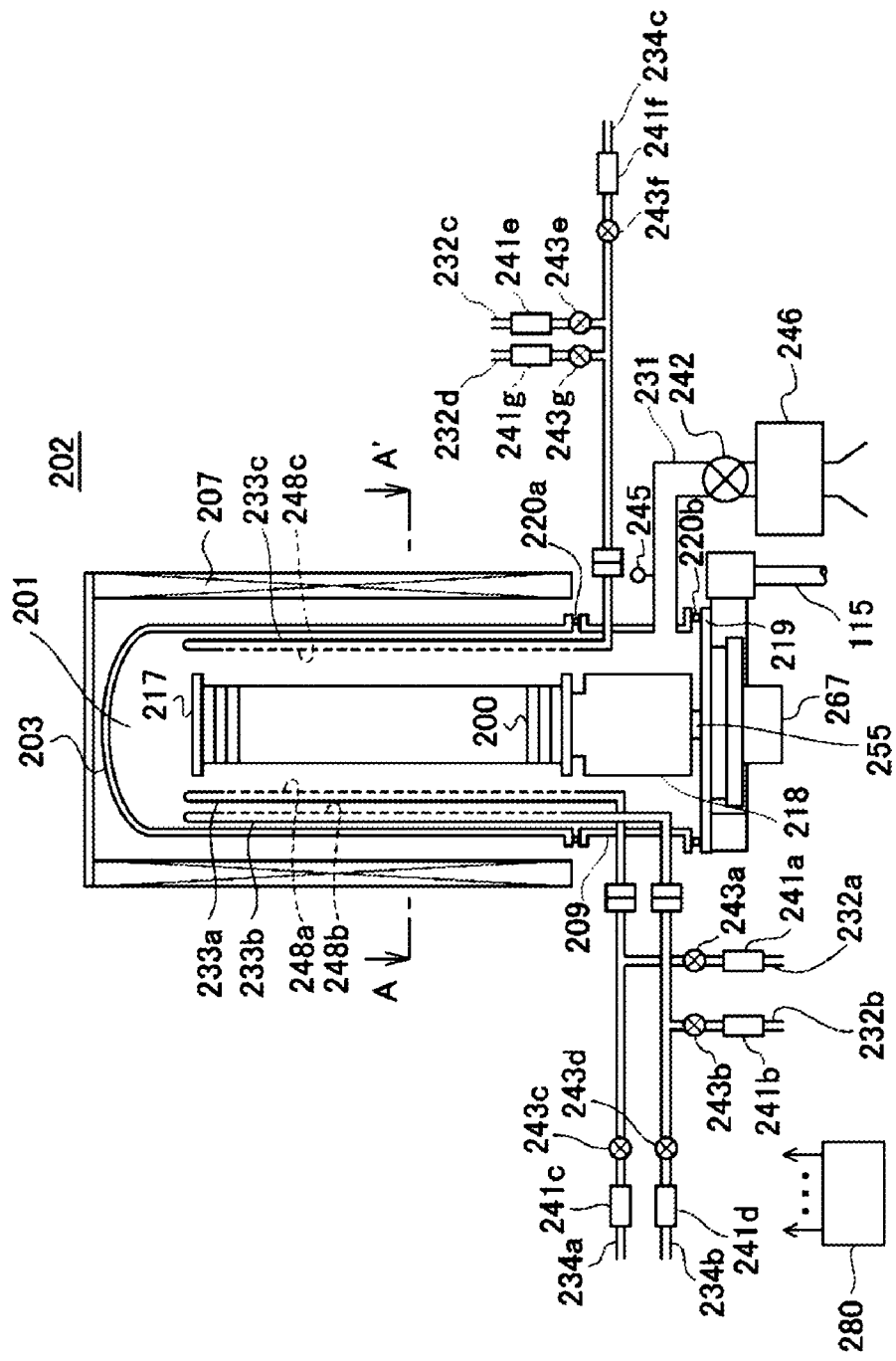
FIG. 1 is a schematic view illustrating a vertical process furnace of a substrate processing apparatus that can be suitably used according to an embodiment of the present invention, FIG. 1 illustrating a vertical sectional view of the process furnace.
Figure 2:
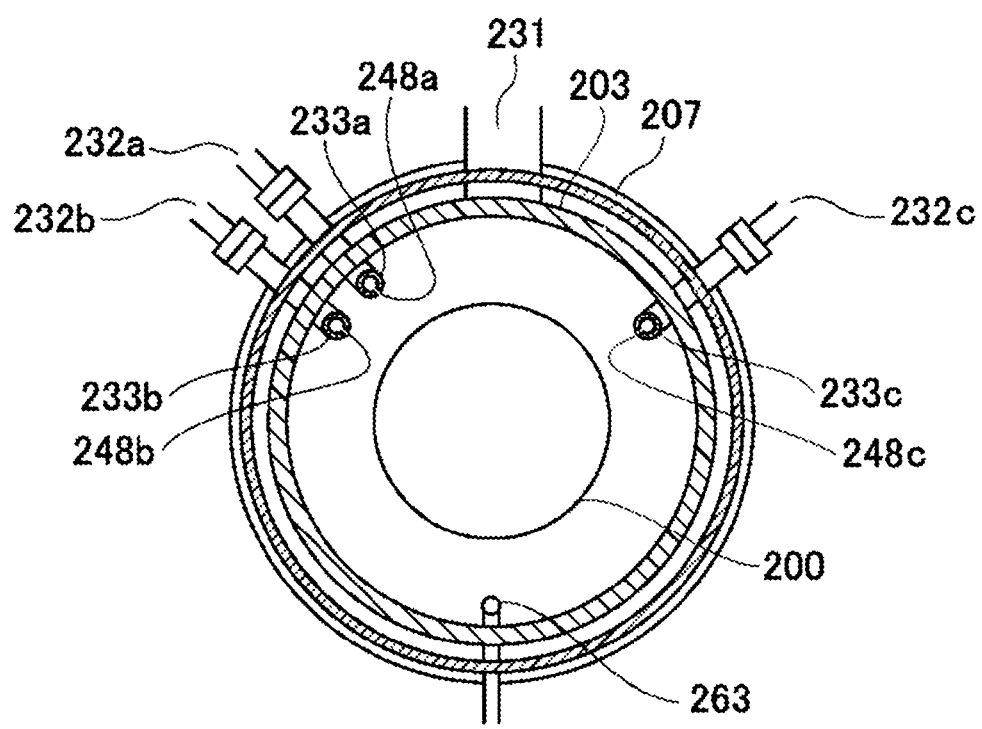
FIG. 2 is a schematic view illustrating the vertical process furnace of the substrate processing apparatus that can be suitably used according to the embodiment of the present invention, FIG. 2 illustrating a sectional view taken along line A-A' of FIG. 1.

FIG. 1 is a schematic vertical sectional view illustrating a vertical process furnace 202 of a substrate processing apparatus that can be suitably used according to an embodiment of the present invention. In addition, FIG. 2 is a sectional view taken along line A-A' of the process furnace 202 of FIG. 1. However, the present invention is not limited to the substrate processing apparatus of the current embodiment. For example, the present invention can be applied to other substrate processing apparatuses such as a substrate processing apparatus having a single-wafer type, hot wall type, or cold wall type process furnace.

As shown in FIG. 1, the process furnace 202 includes a heater 207 as a heating unit (heating mechanism). The heater 207 has a cylindrical shape and is vertically installed in a state where the heater 207 is supported on a heater base (not shown) which is a holding plate.

At the inside of the heater 207, a process tube 203 which is a reaction tube is installed concentrically with the heater 207. The process tube 203 is made of a heat-resistant material such as quartz (SiO$_2$) and silicon carbide (SiC) and has a cylindrical shape with a closed top side and an opened bottom side. In the hollow part of the process tube 203, a process chamber 201 is formed, which is configured to accommodate substrates such as wafers 200 in a state where the wafers 200 are horizontally positioned and vertically arranged in multiple stages in a boat 217 (described later).

At the lower side of the process tube 203, a manifold 209 is installed concentrically with the process tube 203. The manifold 209 is made of a material such as stainless steel and has a cylindrical shape with opened top and bottom sides. The manifold 209 is engaged with the process tube 203 and installed to support the process tube 203. Between the manifold 209 and the process tube 203, an O-ring 220a is installed as a seal member. The manifold 209 is supported by the heater base such that the process tube 203 can be vertically fixed. The process tube 203 and the manifold 209 constitute a reaction vessel (process vessel).

A first gas introduction part such as a first nozzle 233a, a second gas introduction part such as a second nozzle 233b, and a third gas introduction part such as a third nozzle 233c are installed through the manifold 209, and a first gas supply pipe 232a, a second gas supply pipe 232b, and a third gas supply pipe 232c are connected to the first nozzle 233a, the second nozzle 233b, and the third nozzle 233c, respectively. In addition, a fourth gas supply pipe 232d is connected to the third gas supply pipe 232c. In this way, four gas supply pipes are installed as gas supply passages configured to supply a plurality of kinds of gases (herein, four kinds of gases) into the process chamber 201.

At the first gas supply pipe 232a, a flow rate controller (flow rate control unit) such as a mass flow controller 241a, and an on-off valve such as a valve 243a are sequentially installed from the upstream side of the first gas supply pipe 232a. In addition, a first inert gas supply pipe 234a is connected to the downstream side of the valve 243a of the first gas supply pipe 232a to supply an inert gas. At the first inert gas supply pipe 234a, a flow rate controller (flow rate control unit) such as a mass flow controller 241c, and an on-off valve such as a valve 243c are sequentially installed from the upstream side of the first inert gas supply pipe 234a. In addition, the first nozzle 233a is connected to the tip of the first gas supply pipe 232a. In an arc-shaped space between wafers 200 and the inner wall of the process tube 203 constituting the process chamber 201, the first nozzle 233a is erected in a manner such that the first nozzle 233a extends upward from the lower side to the upper side of the inner wall of the process tube 203 in a direction where the wafers 200 are stacked. Gas supply holes 248a are formed in the lateral surface of the first nozzle 233a to supply a gas through the gas supply holes 248a. The gas supply holes 248a have the same size and are arranged at the same pitch from the lower side to the upper side. A first gas supply system is constituted mainly by the first gas supply pipe 232a, the mass flow controller 241a, the valve 243a, and the first nozzle 233a. In addition, a first inert gas supply system is constituted mainly by the first inert gas supply pipe 234a, the mass flow controller 241c, and the valve 243c.

At the second gas supply pipe 232b, a flow rate controller (flow rate control unit) such as a mass flow controller 241b, and an on-off valve such as a valve 243b are sequentially installed from the upstream side of the second gas supply pipe 232b. In addition, a second inert gas supply pipe 234b is connected to the downstream side of the valve 243b of the second gas supply pipe 232b to supply an inert gas. At the second inert gas supply pipe 234b, a flow rate controller (flow rate control unit) such as a mass flow controller 241d, and an on-off valve such as a valve 243d are sequentially installed from the upstream side of the second inert gas supply pipe 234b. In addition, the second nozzle 233b is connected to the tip of the second gas supply pipe 232b. In an arc-shaped space between the wafers 200 and the inner wall of the process tube 203 constituting the process chamber 201, the second nozzle 233b is erected in a manner such that the second nozzle 233b extends upward from the lower side to the upper side of the inner wall of the process tube 203 in a direction where the wafers 200 are stacked. Gas supply holes 248b are formed in the lateral surface of the second nozzle 233b to supply a gas through the gas supply holes 248b. The gas supply holes 248b have the same size and are arranged at the same pitch from the lower side to the upper side. A second gas supply system is constituted mainly by the second gas supply pipe 232b, the mass flow controller 241b, the valve 243b, and the second nozzle 233b. In addition, a second inert gas supply system is constituted mainly by the second inert gas supply pipe 234b, the mass flow controller 241d, and the valve 243d.

At the third gas supply pipe 232c, a flow rate controller (flow rate control unit) such as a mass flow controller 241e, and an on-off valve such as a valve 243e are sequentially installed from the upstream side of the third gas supply pipe 232c. In addition, a third inert gas supply pipe 234c is connected to the downstream side of the valve 243e of the third gas supply pipe 232c to supply an inert gas. At the third inert gas supply pipe 234c, a flow rate controller (flow rate control unit) such as a mass flow controller 241f, and an on-off valve such as a valve 243f are sequentially installed from the upstream side of the third inert gas supply pipe 234c. In addition, the fourth gas supply pipe 232d is connected to the downstream side of the valve 243e of the third gas supply pipe 232c. At the fourth gas supply pipe 232d, a flow rate controller (flow rate control unit) such as a mass flow controller 241g, and an on-off valve such as a valve 243g are sequentially installed from the upstream side of the fourth gas supply pipe 232d. In addition, the third nozzle 233c is connected to the tip of the third gas supply pipe 232c. In an arc-shaped space between the wafers 200 and the inner wall of the process tube 203 constituting the process chamber 201, the third nozzle 233c is erected in a manner such that the third nozzle 233c extends upward from the lower side to the upper side of the inner wall of the process tube 203 in a direction where the wafers 200 are stacked. Gas supply holes 248c are formed in the lateral surface of the third nozzle 233c to supply a gas. The gas supply holes 248c have the same size and are arranged at the same pitch from the lower side to the upper side. A third gas supply system is constituted mainly by the third gas supply pipe 232c, the mass flow controller 241e, the valve 243e, and the third nozzle 233c. A fourth gas supply system is constituted mainly by the fourth gas supply pipe 232d, the mass flow controller 241g, the valve 243g, the third gas supply pipe 232c, and the third nozzle 233c. In addition, a third inert gas supply system is constituted mainly by the third inert gas supply pipe 234c, the mass flow controller 241f, and the valve 243f.

Gas containing oxygen (oxygen-containing gas) such as oxygen ($O_2$) gas is supplied from the first gas supply pipe 232a into the process chamber 201 through the mass flow controller 241a, the valve 243a, and the first nozzle 233a. That is, the first gas supply system is configured as an oxygen-containing gas supply system. At this time, an inert gas may be supplied from the first inert gas supply pipe 234a into the first gas supply pipe 232a through the mass flow controller 241c and the valve 243c.

In addition, gas containing hydrogen (hydrogen-containing gas) such as hydrogen ($H_2$) gas is supplied from the second gas supply pipe 232b into the process chamber 201 through the mass flow controller 241b and the valve 243b, and the second nozzle 233b. That is, the second gas supply system is configured as a hydrogen-containing gas supply system. At this time, an inert gas may be supplied from the second inert gas supply pipe 234b into the second gas supply pipe 232b through the mass flow controller 241d and the valve 243d.

Alternatively, gas containing nitrogen (nitrogen-containing gas) such as ammonia ($NH_3$) gas may be supplied from the second gas supply pipe 232b into the process chamber 201 through the mass flow controller 241b, the valve 243b, and the second nozzle 233b. That is, the second gas supply system may be configured as a nitrogen-containing gas supply system. At this time, an inert gas may be supplied from the second inert gas supply pipe 234b into the second gas supply pipe 232b through the mass flow controller 241d and the valve 243d.

In addition, a first source gas, that is, a first source gas containing silicon (first silicon-containing gas) such as hexachlorodisilane ($Si_2Cl_6$, abbreviation: HCD) is supplied from the third gas supply pipe 232c into the process chamber 201 through the mass flow controller 241e, the valve 243e, and the third nozzle 233c. That is, the third gas supply system is configured as a first source gas supply system (first silicon-containing gas supply system). At this time, an inert gas may be supplied from the third inert gas supply pipe 234c into the third gas supply pipe 232c through the mass flow controller 241f and the valve 243f.

In addition, a second source gas, that is, a second source gas containing silicon (second silicon-containing gas) such as dichlorosilane ($SiH_2Cl_2$, abbreviation: DCS) is supplied from the fourth gas supply pipe 232d into the process chamber 201 through the mass flow controller 241g, the valve 243g, and the third nozzle 233c. That is, the fourth gas supply system is configured as a second source gas supply system (second silicon-containing gas supply system). At this time, an inert gas may be supplied from the third inert gas supply pipe 234c into the third gas supply pipe 232c through the mass flow controller 241f and the valve 243f.

A reaction gas supply system is constituted by the first gas supply system and the second gas supply system, and a source gas supply system is constituted by the third gas supply system and the fourth gas supply system.

In the current embodiment, $O_2$ gas, $H_2$ gas (or $NH_3$ gas), HCD gas, and DCS gas are supplied into the process chamber 201 through different nozzles. However, for example, $H_2$ gas and HCD gas may be supplied into the process chamber 201 through the same nozzle. In addition, $O_2$ gas and $H_2$ gas may be supplied into the process chamber 201 through the same nozzle. In this way, if a plurality of kinds of gases are supplied through the same nozzle, many merits can be obtained. For example, fewer nozzles may be used for reducing apparatus costs, and maintenance works may be easily carried out. In addition, oxidizing power and oxidizing power uniformity can be improved by supplying $O_2$ gas and $H_2$ gas into the process chamber 201 through the same nozzle. In a film-forming temperature range (described later), HCD gas and $O_2$ gas may react with each other although HCD gas and $H_2$ gas do not react with each other. Therefore, it may be preferable that HCD gas and $O_2$ gas are supplied through different nozzles. Furthermore, in the current embodiment, HCD gas and DCS gas are previously mixed with each other in the same supply pipe (third gas supply pipe 232c) and are then supplied into the process chamber 201 through the same nozzle (the third nozzle 233c). However, HCD gas and DCS gas may be supplied into the process chamber 201 through different supply pipes and nozzles.

At the manifold 209, an exhaust pipe 231 is installed to exhaust the inside atmosphere of the process chamber 201. A vacuum exhaust device such as a vacuum pump 246 is connected to the exhaust pipe 231 through a pressure detector such as a pressure sensor 245 and a pressure regulator (pressure regulating part) such as a auto pressure controller (APC) valve 242. The APC valve 242 is an on-off valve, which can be opened and closed to start and stop vacuum evacuation of the inside of the process chamber 201 and can be adjusted in degree of valve opening for pressure adjustment. By controlling the degree of opening of the APC valve 242 based on pressure information detected by the pressure sensor 245 while operating the vacuum pump 246, the inside of the process chamber 201 can be vacuum-evacuated to a predetermined pressure (vacuum degree). An exhaust system is constituted mainly by the exhaust pipe 231, the pressure sensor 245, the APC valve 242, and the vacuum pump 246.

At the lower side of the manifold 209, a seal cap 219 is installed as a furnace port cover capable of hermetically closing the opened bottom side of the manifold 209. The seal cap 219 is configured to be brought into contact with the manifold 209 in a vertical direction from the bottom side of the manifold 209. The seal cap 219 is made of a metal such as stainless steel and has a circular disk shape. On the top surface of the seal cap 219, an O-ring 220b is installed as a seal member configured to make contact with the bottom side of the manifold 209. At a side of the seal cap 219 opposite to the process chamber 201, a rotary mechanism 267 is installed to rotate a substrate holding tool such as the boat 217 (described later). A shaft 255 of the rotary mechanism 267 penetrates the seal cap 219 and is connected to the boat 217. By rotating the boat 217 with the rotary mechanism 267, wafers 200 can be rotated. The seal cap 219 is configured to be vertically moved by an elevating mechanism such as a boat elevator 115 installed outside the process tube 203. The boat elevator 115 is configured so that the boat 217 can be loaded into and unloaded from the process chamber 201 by raising and lowering the seal cap 219 with the boat elevator 115.

The boat 217, which is a substrate holding tool, is made of a heat-resistant material such as quartz or silicon carbide and is configured to support a plurality of wafers 200 in a state where the wafers 200 are horizontally oriented and arranged in multiple stages with the centers of the wafers 200 being aligned with each other. At the lower part of the boat 217, an insulating member 218 made of a heat-resistant material such as quartz or silicon carbide is installed so as to prevent heat transfer from the heater 207 to the seal cap 219. The insulating member 218 may include a plurality of insulating plates made of a heat-resistant material such as quartz or silicon carbide, and an insulating plate holder configured to support the insulating plates in a state where the insulating plates are horizontally oriented and arranged in multiple stages. In the process tube 203, a temperature sensor 263 is installed as a temperature detector, and based on temperature information detected by the temperature sensor 263, power to the heater 207 is controlled to obtain a desired temperature distribution in the process chamber 201. Like the first nozzle 233a, the second nozzle 233b, and the third nozzle 233c, the temperature sensor 263 is installed along the inner wall of the process tube 203.

A controller 280, which is a control part (control unit), is connected to devices such as the mass flow controllers 241a, 241b, 241c, 241d, 241e, 241f, and 241g; valves 243a, 243b, 243c, 243d, 243e, 243f, and 243g; the pressure sensor 245; the APC valve 242; the heater 207; the temperature sensor 263; the vacuum pump 246; the rotary mechanism 267; and the boat elevator 115. The controller 280 controls operations such as: flow rate control operations of the mass flow controllers 241a, 241b, 241c, 241d, 241e, 241f, and 241g; opening and closing operations of the valves 243a, 243b, 243c, 243d, 243e, 243f, and 243g; opening and closing operations of the APC valve 242 and a pressure adjusting operation of the APC valve 242 performed based on the pressure sensor 245; a temperature adjusting operation of the heater 207 performed based on the temperature sensor 263; starting and stopping operations of the vacuum pump 246; a rotation speed adjusting operation of the rotary mechanism 267; and ascending and descending operations of the boat 217 carried out by the boat elevator 115.

Next, an explanation will be given on an exemplary method of forming an insulating film such as an oxide film on a substrate by using the process furnace 202 of the substrate processing apparatus in one process of processes of manufacturing a semiconductor device. In the following description, the controller 280 controls parts of the substrate processing apparatus.

Figure 3:
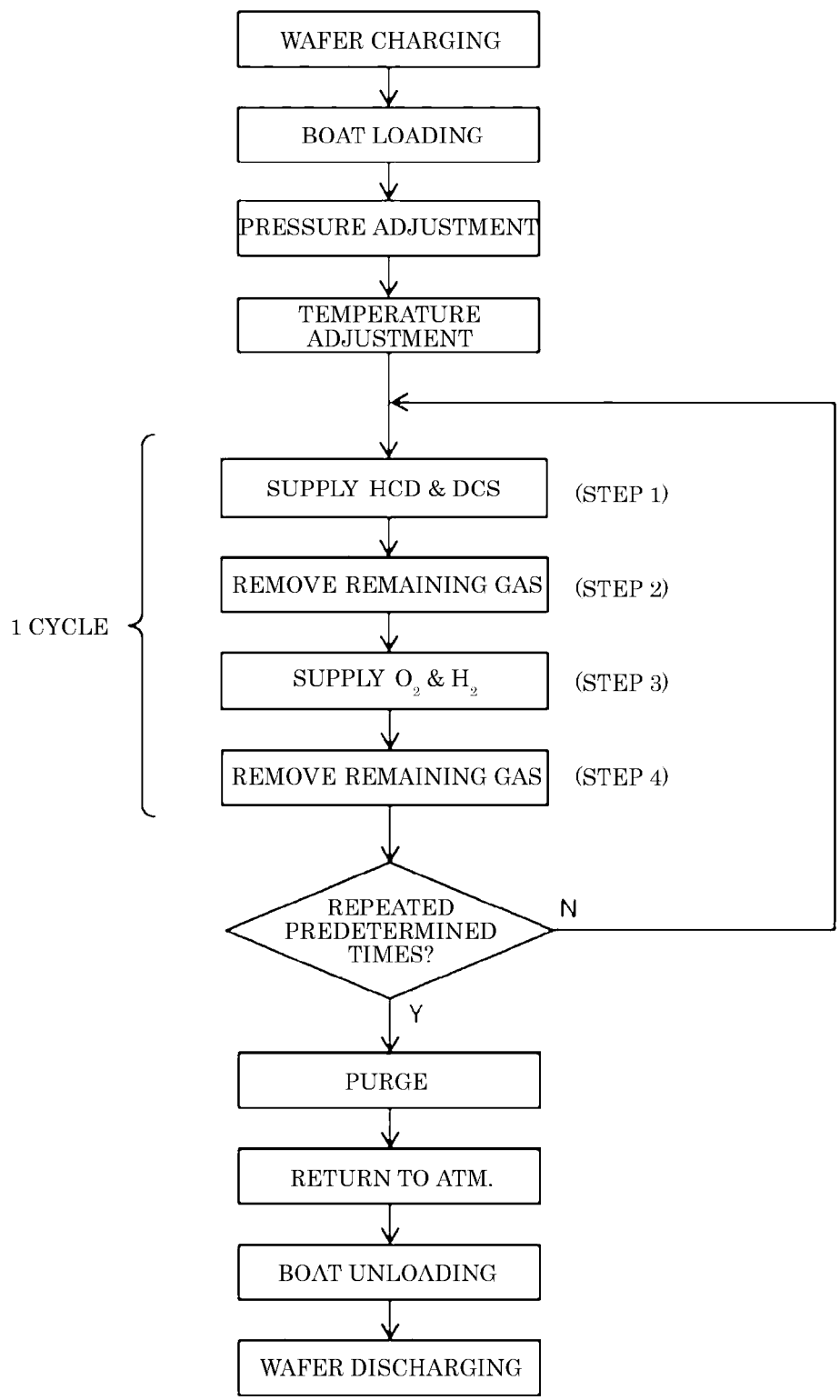
FIG. 3 is a flowchart for explaining film-forming flows according to the embodiment of the present invention.
Figure 4:
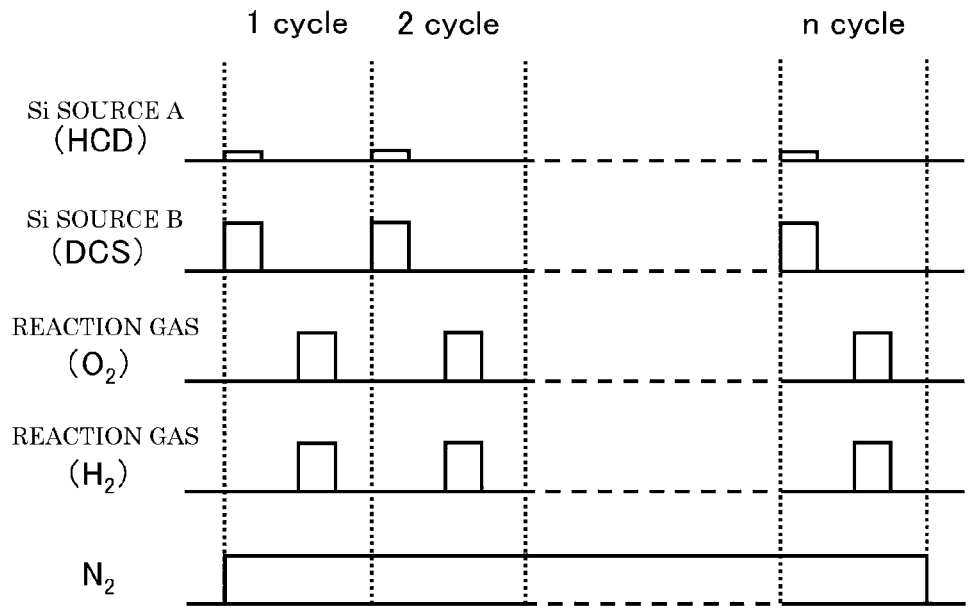
FIG. 4 illustrates exemplary gas supply timing according to a film-forming sequence of the embodiment of the present invention, in which hexachlorodisilane (HCD) gas and dichlorosilane (DCS) gas are simultaneously supplied and are then simultaneously stopped, and $O_2$ gas and $H_2$ gas are supplied.
Figure 5:
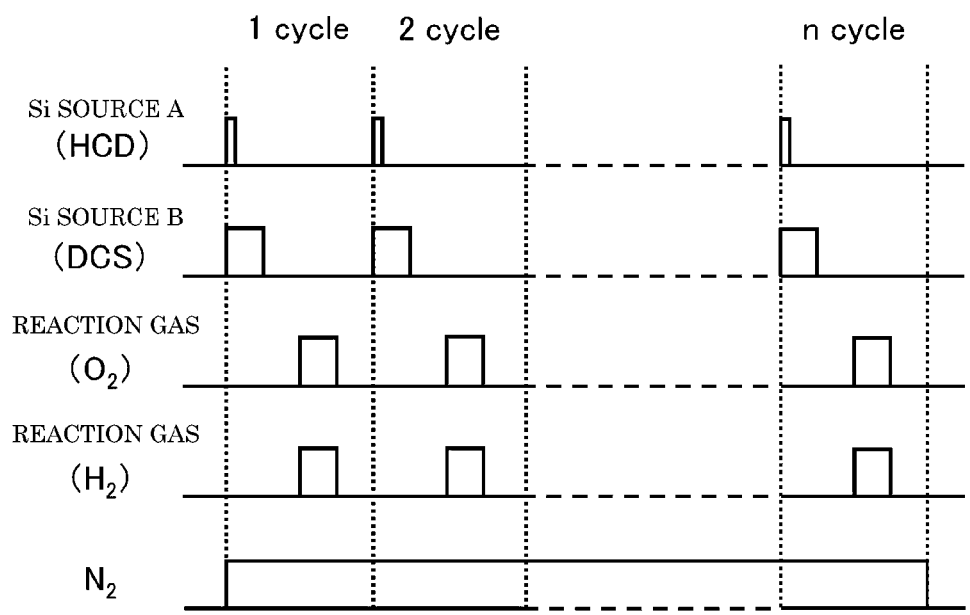
FIG. 5 illustrates exemplary gas supply timing according to a film-forming sequence of the embodiment of the present invention, in which HCD gas and DCS gas are simultaneously supplied, and after the supply of HCD gas is first stopped and then the supply of DCS gas is stopped, $O_2$ gas and $H_2$ gas are supplied.

FIG. 3 illustrates a film-forming flow according to the current embodiment, and FIG. 4, FIG. 5 and FIG. 6 illustrate gas supply timings according to film-forming sequences of the current embodiment. According to the film-forming sequences of the current embodiment, a silicon oxide film is formed on a substrate to a predetermined thickness by alternately performing the following processes: a process of forming a layer containing a predetermined element such as a silicon-containing layer on the substrate by supplying at least two kinds of source gases containing silicon as the predetermined element, such as a first source gas containing silicon (HCD gas) and a second source gas containing silicon (DCS gas), into the process vessel in which the substrate is accommodated; and a process of changing the silicon-containing layer into a silicon oxide layer by supplying reaction gases different from the first source gas and the second source gas, such as an oxygen-containing gas ($O_2$ gas) and a hydrogen-containing gas ($H_2$ gas), into the process vessel. The first source gas is more reactive than the second source gas, and in the process of forming the silicon-containing layer on the substrate, the supply amount of the first source gas is set to be less than the supply amount of the second source gas.

The process of forming the silicon-containing layer on the substrate is carried out under a condition where a CVD reaction is caused. In the process, a silicon layer including less than one atomic layer to several atomic layers is formed on the substrate as a silicon-containing layer. The silicon-containing layer may be a source gas adsorption layer. That is, the silicon-containing layer may be a first source gas adsorption layer and a second source gas adsorption layer. The silicon layer is a general term used to denote a layer made of silicon, such as a continuous silicon layer, a discontinuous silicon layer, and a thin film in which such layers are overlapped. In addition, a continuous layer made of silicon may also be called "a thin silicon film." In addition, a source gas adsorption layer is a term including a continuous layer formed by chemical adsorption of molecules of a source gas and a discontinuous layer formed by chemical adsorption of molecules of a source gas. Furthermore, the expression "a layer less than one atomic layer" is used to denote a discontinuous atomic layer. In a condition where a source gas decomposes by itself, a silicon layer is formed on a substrate by deposition of silicon on the substrate. In a condition where a source gas does not decompose by itself, a source gas adsorption layer is formed on a substrate by adsorption of the source gas on the substrate. The former case where a silicon layer is formed on a substrate is more preferable than the latter case where a source gas adsorption layer is formed on a substrate because the film growth rate of the former case is higher than that of the latter case.

Furthermore, in the process of changing the silicon-containing layer into the silicon oxide layer, the reaction gas is activated by heat and is supplied so as to change the silicon-containing layer into the silicon oxide layer by oxidizing the silicon-containing layer. At that time, the oxygen-containing gas and the hydrogen-containing gas which are reaction gases are caused to react with each other in the process vessel at a pressure lower than atmospheric pressure so as to produce an oxidizing species containing oxygen, and the silicon-containing layer is changed into the silicon oxide layer by using the oxidizing species. By this oxidizing treatment, oxidizing power can be largely increased as compared with the case where only an oxygen-containing gas is supplied. That is, by adding a hydrogen-containing gas to an oxygen-containing gas under a depressurized atmosphere, oxidizing power can be largely increased as compared with the case where only an oxygen-containing gas is supplied. The process of changing the silicon-containing layer into the silicon oxide layer is performed under a depressurized atmosphere without using plasma. Alternatively, only an oxygen-containing gas may be used as the reaction gas.

(Application to Formation of SiO Film)

Hereinafter, a detailed explanation will be given. In the following description, an explanation will be given on an exemplary case where silicon oxide films ($SiO_2$ films) are formed on substrates as insulating films according to the film-forming flow shown in FIG. 3 and the film-forming sequences shown in FIG. 4, FIG. 5, and FIG. 6 by using HCD gas as a first source gas containing silicon, DCS gas as a second source gas containing silicon, $O_2$ gas as an oxygen-containing gas (reaction gas), and $H_2$ gas as a hydrogen-containing gas (reaction gas).

After a plurality of wafers 200 are charged into the boat 217 (wafer charging), as shown in FIG. 1, the boat 217 in which the plurality of wafers 200 are held is lifted and loaded into the process chamber 201 by the boat elevator 115 (boat loading). In this state, the bottom side of the manifold 209 is sealed by the seal cap 219 with the O-ring 220b being disposed therebetween.

The inside of the process chamber 201 is vacuum-evacuated to a desired pressure (vacuum degree) by using the vacuum pump 246. At this time, the pressure inside the process chamber 201 is measured by the pressure sensor 245, and based on the measured pressure, the APC valve 242 is feedback-controlled (pressure adjustment). In addition, the inside of the process chamber 201 is heated to a desired temperature by using the heater 207. At this time, to obtain desired temperature distribution inside the process chamber 201, power to the heater 207 is feedback-controlled based on temperature information measured by the temperature sensor 263 (temperature adjustment). Next, the boat 217 is rotated by the rotary mechanism 267 to rotate the wafers 200. Then, the following four steps are sequentially performed.

[Step 1]

The valve 243e of the third gas supply pipe 232c, the valve 243f of the third inert gas supply pipe 234c are opened to supply HCD gas through the third gas supply pipe 232c and an inert gas (for example, $N_2$ gas) through the third inert gas supply pipe 234c. In addition, the valve 243g of the fourth gas supply pipe 232d is opened to supply DCS gas through the fourth gas supply pipe 232d. The flow rate of the inert gas flowing through the third inert gas supply pipe 234c is controlled by the mass flow controller 241f. The flow rate of the HCD gas flowing through the third gas supply pipe 232c is controlled by the mass flow controller 241e. The flow rate of the DCS gas flowing through the fourth gas supply pipe 232d is controlled by the mass flow controller 241g. The HCD gas, the DCS gas, and the inert gas that are adjusted in flow rate are mixed with each other in the third gas supply pipe 232c. Then, the HCD gas, the DCS gas, and the inert gas are supplied through the gas supply holes 248c of the third nozzle 233c into the process chamber 201 which is heated and depressurized, and the gases are exhausted through the exhaust pipe 231 (HCD and DCS supply).

At this time, as shown in FIG. 4, FIG. 5, and FIG. 6, in step 1, the supply amount of the HCD gas is set to be less than the supply amount of the DCS gas. That is, in step 1, the supply amount of the HCD is very small as compared with the supply amount of the DCS gas. In FIG. 4, FIG. 5, and FIG. 6, the horizontal axes denote time, and the vertical axes denote gas supply flow rates. The areas of rectangles, which denote a gas supply state in each step, stand for gas supply amounts in each step.

In step 1, preferably, the supply amount of HCD gas with respect to the supply amount of DCS gas, that is, the ratio of HCD supply amount/DCS supply amount (ratio of HCD/DCS) is in the range from 0.03 (3%) to 0.5 (50%). More preferably, the ratio of HCD/DCS may be in the range from 0.06 (6%) to 0.5 (50%). If the ratio of HCD/DCS is lower than 3%, DCS adsorption probability and silicon deposition probability on a wafer are reduced, and thus it may be difficult to increase the growth rate of a film. In addition, it may be difficult to guarantee film thickness uniformity. In addition, if the ratio of HCD/DCS is lower than 6%, it may be difficult to saturate adsorption of HCD and DCS and deposition of silicon on a wafer. If the ratio of HCD/DCS is higher than 50%, there is a potential problem of more byproducts or particles. Furthermore, material costs may be less reduced. That is, by maintaining the ratio of HCD/DCS in the range from 3% to 50%, DCS adsorption probability and silicon deposition probability on a wafer can be increased, and thus the growth rate of a film can increased. In addition, film thickness uniformity can be improved. Moreover, generation of byproducts and particles can be suppressed, and material costs can be largely reduced. In addition, by maintaining the ratio of HCD/DCS in the range from 6% to 50%, adsorption of HCD and DCS and deposition of silicon on a wafer can be easily saturated to increase the growth rate of a film much more. In addition, film thickness uniformity can be further improved. In addition, generation of byproducts and particles can be further suppressed, and material costs can be reduced much more.

At this time, as shown in FIG. 4, while keeping the supply flow rate of HCD gas lower than the supply flow rate of DCS gas, the HCD gas and the DCS gas may be simultaneously supplied. That is, while keeping the supply flow rate of HCD gas lower than the supply flow rate of DCS gas, supplies of the HCD gas and the DCS gas may be started at the same time and stopped at the same time to supply the HCD gas and the DCS gas during the same time period. In the case of the supply method shown in FIG. 4, the valve 243e and the valve 243g can be opened and closed at the same timing, and thus valve control can be easily performed.

In addition, as shown in FIG. 5, while keeping the supply flow rate of HCD gas equal to the supply flow rate of DCS gas, the HCD gas and the DCS gas may be simultaneously supplied, and then the supply of HCD gas may be first stopped. That is, while keeping the supply flow rate of HCD gas equal to the supply flow rate of DCS gas, supplies of the HCD gas and the DCS gas may be started at the same time, and after stopping the supply of HCD gas in advance, only the DCS gas may be continuously supplied for a predetermined time and then stopped to make the supply time of HCD gas shorter than the supply time of DCS gas. In the supply method shown in FIG. 5, when HCD gas and DCS gas are initially supplied, the supply amount of HCD gas is large as compared with the supply method of FIG. 4, and thus it is possible to rapidly obtain a state where DCS gas is easily adsorbed on a wafer.

Thereafter, when only the DCS gas is supplied, the DCS gas can be adsorbed on the wafer at a higher rate.

In addition, as shown in FIG. 6, while keeping the supply flow rate of HCD gas equal to the supply flow rate of DCS gas, the HCD gas may be supplied before the DCS gas is supplied. That is, while keeping the supply flow rate of HCD gas equal to the supply flow rate of DCS gas, the HCD gas may be first supplied, and at the time when the supply of HCD gas is stopped, the supply of DCS gas may be started and then stopped, so as to make the supply time of HCD gas shorter than the supply time of DCS gas. Alternatively, after starting the supply of HCD gas, the supply of DCS gas may be started before stopping the supply of HCD gas, and then, the supply of HCD gas may be stopped in a state where the DCS gas is continuously supplied. In this case, the supply time of HCD gas is also kept shorter than the supply time of DCS gas. In the case of the supply method shown in FIG. 6, since HCD gas is supplied before DCS gas is supplied, a state where DCS gas can be easily adsorbed on a surface of a wafer can be obtained before the DCS gas is supplied. Thereafter, when only the DCS gas is supplied, the adsorption rate of the DCS gas on the wafer can be high.

In addition, the above-described supply methods may be properly combined. For example, the supply flow rate of HCD gas may be kept lower than the supply flow rate of DCS gas, and the supply time of HCD gas may be kept shorter than the supply time of DCS gas.

Alternatively, the supply amount of HCD gas may be kept smaller than the supply amount of DCS gas, for example, in a way of maintaining the supply flow rate of HCD gas lower than the supply flow rate of DCS gas and supplying the HCD gas for a longer time than the DCS gas, or in a way of maintaining the supply flow rate of HCD gas higher than the supply flow rate of DCS gas and supplying the HCD gas for a shorter than the DCS gas.

In this way, the supply amount of HCD gas can be kept less than the supply amount of DCS gas by keeping the supply flow rate of HCD gas lower than the supply flow rate of DCS gas, or keeping the supply time of HCD gas shorter than the supply time of DCS gas, or keeping the supply flow rate of HCD gas lower than the supply flow rate of DCS gas and the supply time of HCD gas shorter than the supply time of DCS gas.

At this time, the APC valve 242 is properly controlled to keep the inside of the process chamber 201 at a pressure lower than the atmospheric pressure, for example, at a process ranging from 10 Pa to 1,000 Pa. The supply flow rate of HCD gas is controlled by the mass flow controller 241e, for example, in the range of 1 sccm to 500 sccm. The wafers 200 are exposed to the HCD gas, for example, for 1 second to 120 seconds. The supply flow rate of the DCS gas is controlled by the mass flow controller 241g, for example, in the range from 1 sccm to 5000 sccm. The wafers 200 are exposed to the DCS gas, for example, for 1 second to 120 seconds. The temperature of the heater 207 is set such that a CVD reaction can be caused in the process chamber 201. That is, the temperature of the heater 207 is set such that the temperature of the wafers 200 can be kept in the range from 350° C. to 850° C., preferably, in the range from 400° C. to 700° C. If the temperature of the wafers 200 is lower than 350° C., adsorption of HCD and DCS on the wafers 200, and decomposition of HCD and DCS are difficult. In addition, if the temperature of the wafers 200 is lower than 400° C., the film growth rate becomes lower than a practically acceptable level. On the other hand, if the temperature of the wafers 200 is higher than 700° C., particularly, higher than 850° C., CVD reaction becomes very active to reduce uniformity. Therefore, the wafers 200 may be kept in the temperature range from 350° C. to 850° C., preferably, in the range from 400° C. to 700° C.

By supplying HCD gas and DCS gas into the process chamber 201 under the above-described conditions, silicon layers (Si layers) can be formed on the wafers 200 (on the under-layer films of the wafers 200) as silicon-containing layers each constituted by less than one atomic layer to several atomic layers. The silicon-containing layers may be chemical adsorption layers of HCD gas or DCS gas. In a condition where HCD gas or DCS gas decomposes by itself, silicon layers are formed on the wafers 200 by deposition of silicon on the wafers 200. In a condition where HCD gas or DCS gas does not decompose by itself, HCD gas or DCS gas chemical adsorption layers are formed on the wafers 200 by chemical adsorption of the HCD gas or DCS gas on the wafers 200. If the thickness of a silicon-containing layer formed on the wafer 200 is greater than the thickness of several atomic layers, the silicon-containing layer may not be entirely oxidized in step 3 (described later). In addition, the minimum of a silicon-containing layer that can be formed on the wafer 200 is less than one atomic layer. Therefore, preferably, the thickness of the silicon-containing layer is in the range from the thickness of less than one atomic layer to the thickness of several atomic layers.

Instead of using an inorganic source such as HCD as the first source containing silicon, an organic source may be used. Examples of the organic source include an aminosilane-based substance such as 4DMAS (tetrakisdimethylaminosilane, $Si[N(CH_3)_2]_4$), 3DMAS (trisdimethylaminosilane, $Si[N(CH_3)_2]_3H$), 2DEAS (bisdiethylaminosilane, $Si[N(C_2H_5)_2]_2H_2$, and BTBAS (bistertiarybutylaminosilane, $SiH_2[NH(C_4H_6)]_2$). Furthermore, instead of using DCS as the second source containing silicon, an inorganic source such as TCS (tetrachlorosilane, $SiCl_4$), monosilane ($SiH_4$), and disilane ($Si_2H_6$) may be used.

Instead of using $N_2$ gas, a rare gas such as Ar gas, He gas, Ne gas, and Xe gas may be used as the inert gas. If a rare gas such as Ar gas or He gas that does not contain nitrogen (N) is used as the inert gas, a silicon oxide film having a low nitrogen (N) concentration (impurity concentration) can be formed. Therefore, it is preferable that a rare gas such as Ar and He gas is used as the inert gas. This is the same as in step 2, step 3, and step 4 (described later).

[Step 2]

After the silicon-containing layers are formed on the wafers 200, the valve 243e of the third gas supply pipe 232c is closed to interrupt the supply of HCD gas. Thereafter, the valve 243g of the fourth gas supply pipe 232d is closed to interrupt the supply of DCS gas. At this time, the APC valve 242 of the exhaust pipe 231 is kept open, and the inside of the process chamber 201 is vacuum-evacuated by using the vacuum pump 246 so as to remove HCD gas and DCS gas remaining in the process chamber 201. At this time, if an inert gas is supplied into the process chamber 201, the remaining HCD gas and DCS gas can be removed more efficiently (remaining gas removal). At this time, the temperature of the heater 207 is set in a predetermined range so that the temperature of the wafers 200 can be in the range from 350° C. to 850° C., preferably, in the range from 400° C. to 700° C. like in the case where HCD gas and DCS gas are supplied.

[Step 3]

After the remaining gas is removed from the inside of process chamber 201, the valve 243a of the first gas supply pipe 232a and the valve 243c of the first inert gas supply pipe 234a are opened to supply $O_2$ gas through the first gas supply pipe 232a and an inert gas through the first inert gas supply pipe 234a. The flow rate of the inert gas flowing through the first inert gas supply pipe 234a is controlled by the mass flow controller 241c. The flow rate of the $O_2$ gas flowing through the first gas supply pipe 232a is controlled by the mass flow controller 241a. The $O_2$ gas and the inert gas that are adjusted in flow rate are mixed with each other in the first gas supply pipe 232a. Then, the $O_2$ gas and the inert gas are supplied through the gas supply holes 248a of the first nozzle 233a into the process chamber 201 which is heated and depressurized, and the $O_2$ gas and the inert gas are exhausted through the exhaust pipe 231.

Simultaneously, the valve 243b of the second gas supply pipe 232b, and the valve 243d of the second inert gas supply pipe 234b are opened to supply $H_2$ gas through the second gas supply pipe 232b and an inert gas through the second inert gas supply pipe 234b. The flow rate of the inert gas flowing through the second inert gas supply pipe 234b is controlled by the mass flow controller 241d. The flow rate of the $H_2$ gas flowing through the second gas supply pipe 232b is controlled by the mass flow controller 241b. The $H_2$ gas and the inert gas that are adjusted in flow rate are mixed with each other in the second gas supply pipe 232b. Then, the $H_2$ gas and the inert gas are supplied through the gas supply holes 248b of the second nozzle 233b into the process chamber 201 which is heated and depressurized, and the $H_2$ gas and the inert gas are exhausted through the exhaust pipe 231 ($O_2$ and $H_2$ supply). The $O_2$ gas and the $H_2$ gas are supplied into the process chamber 201 without being activated by plasma.

At this time, the APC valve 242 is properly controlled to keep the inside of the process chamber 201 at a pressure lower than the atmospheric pressure, for example, at a pressure ranging from 1 Pa to 1,000 Pa. The flow rate of $O_2$ gas controlled by the mass flow controller 241a is, for example, in the range of 1 sccm to 20,000 sccm (20 slm). The flow rate of $H_2$ gas controlled by the mass flow controller 241b is, for example, in the range of 1 sccm to 20,000 sccm (20 slm). The wafers 200 are exposed to the $O_2$ gas and $H_2$ gas, for example, for 1 second to 120 seconds. The temperature of the heater 207 is set such that the temperature of the wafers 200 can be kept, for example, in the range from 350° C. to 1,000° C. It was ascertained that oxidizing power could be improved by adding $H_2$ gas to $O_2$ gas under a depressurized atmosphere in the above-described temperature range. In addition, it was also ascertained that oxidizing power could not be improved if the temperature of the wafers 200 was too low. Thus, when the throughput is considered, as long as oxidizing power can be improved, it is preferable that the wafers 200 are kept at the same temperature as in step 1 where HCD gas is supplied. That is, it is preferable that the temperature of the heater 207 is set to keep the inside of the process chamber 201 in the same temperature in step 1 and step 3. In this case, the temperature of the heater 207 is set such that the temperature of the wafers 200, that is, the inside temperature of the process chamber 201 can be kept at a constant temperature in the range from 350° C. to 850° C., preferably, in the range from 400° C. to 700° C. in step 1 and step 3. In addition, it is preferable that the temperature of the heater 207 is set such that the inside temperature of the process chamber 201 can be kept at the same temperature in step 1 through step 4 (described later). In this case, the temperature of the heater 207 is set such that the inside temperature of the process chamber 201 can be kept at a constant temperature in the range from 350° C. to 850° C., preferably, in the range from 400° C. to 700° C. in step 1 through step 4 (described later). In addition, to improve oxidizing power by adding $H_2$ gas to $O_2$ gas under a depressurized atmosphere, it is necessary to keep the inside temperature of the process chamber 201 at 350° C. or higher, preferably 400° C. or higher, more preferably, 450° C. or higher. If the inside temperature of the process chamber 201 is kept at 400° C. or higher, it is possible to obtain oxidizing power greater than that in an $O_3$ oxidizing treatment performed at 400° C. or higher. If the inside temperature of the process chamber 201 is kept at 450° C. or higher, it is possible to obtain oxidizing power greater than that in an $O_2$ plasma oxidizing treatment performed at 450° C. or higher.

By supplying $O_2$ gas and $H_2$ gas into the process chamber 201 under the above-described conditions, the $O_2$ gas and $H_2$ gas can be activated without using plasma under a heated and depressurized atmosphere to react with each other, so that an oxidizing species including oxygen (O) atoms such as atomic oxygen can be produced. Then, the silicon-containing layers formed on the wafers 200 in step 1 are oxidized mainly by the oxidizing species. By the oxidation, the silicon-containing layers are changed into silicon oxide layers ($SiO_2$ layers, hereinafter also referred to as SiO layers simply).

As oxygen ($O_2$)-containing gas, not only oxygen ($O_2$) gas but also another gas such as ozone ($O_3$) gas may be used. According to an experiment in which hydrogen-containing gas was added to nitric oxide (NO) gas or nitrous oxide ($N_2O$) gas in the above-described temperature range, oxidizing power was not improved as compared with the case where only NO gas or $N_2O$ gas was supplied. That is, it is preferable that gas containing oxygen but not nitrogen (that is, gas not containing nitrogen but containing oxygen) is used as an oxygen-containing gas. As hydrogen ($H_2$)-containing gas, not only hydrogen ($H_2$) gas but also another gas such as deuterium ($D_2$) gas may be used. In addition, if gas such as ammonia ($NH_3$) gas or methane ($CH_4$) gas is used, nitrogen (N) or carbon (C) may permeate into films as an impurity. That is, it is preferable that gas containing hydrogen but not any other element (that is, gas not containing other elements than hydrogen) is used as a hydrogen-containing gas. That is, at least one selected from the group consisting of $O_2$ gas and $O_3$ gas may be used as an oxygen-containing gas, and at least one selected from the group consisting of $H_2$ gas and $D_2$ gas may be used as a hydrogen-containing gas.

[Step 4]

After the silicon-containing layers are changed into silicon oxide layers, the valve 243a of the first gas supply pipe 232a is closed to interrupt the supply of $O_2$ gas. In addition, the valve 243b of the second gas supply pipe 232b is closed to interrupt the supply of $H_2$ gas. At this time, the APC valve 242 of the exhaust pipe 231 is kept open, and the inside of the process chamber 201 is vacuum-evacuated by using the vacuum pump 246 so as to remove $O_2$ gas and $H_2$ gas remaining in the process chamber 201. At this time, if an inert gas is supplied into the process chamber 201, the remaining $O_2$ gas and $H_2$ gas can be removed more efficiently (remaining gas removal). At this time, the temperature of the heater 207 is set such that the temperature of the wafers 200 can be in the range from 350° C. to 850° C., preferably, in the range from 400° C. to 700° C. like in the time when $O_2$ gas and $H_2$ gas are supplied.

The above-described step 1 to step 4 are set as one cycle, and the cycle is performed a plurality of times to form silicon oxide films ($SiO_2$ films, hereinafter also referred to as SiO films simply) on the wafers 200 to a predetermined thickness.

After forming the silicon oxide films to a predetermined thickness, inert gas is supplied to the inside of the process chamber 201 and is exhausted from the inside of the process chamber 201 so as to purge the inside of the process chamber 201 (purge). Then, the inside atmosphere of the process chamber 201 is replaced with inert gas, and the inside of the process chamber 201 returns to atmospheric pressure (return to atmospheric pressure).

Thereafter, the boat elevator 115 lowers the seal cap 219 to open the bottom side of the manifold 209 and unload the boat 217 in which the processed wafers 200 are held to the outside of the process tube 203 through the bottom side of the manifold 209 (boat unloading). Then, the processed wafers 200 are discharged from the boat 217 (wafer discharging).

In the above-described step 1, HCD gas, which is expensive as compared than DCS gas but has a shorter incubation time, and DCS gas, which is inexpensive as compared with HCD gas but has a longer incubation time, are simultaneously or sequentially supplied while maintaining the supply amount of the HCD gas smaller than the supply amount of the DCS gas. Therefore, although films are formed in a low temperature range, the rate of film growth can be improved, and process time can be reduced. Films can be formed in a temperature range where a film cannot be formed by using DCS gas alone. In addition, films can be formed in a lower temperature range as compared with a conventional method. In addition, as compared with the case where only HCD gas is used, the controllability of film formation is not deteriorated, and material costs can be largely reduced to reduce semiconductor device manufacturing costs.

In the above-described step 3, an oxidizing species including oxygen (O) atoms such as atomic oxygen is generated by causing a reaction between $O_2$ gas and $H_2$ gas under a heated and depressurized atmosphere, and a changing process is performed by using the oxidizing species, so as to change silicon-containing layers into silicon oxide layers in a way of breaking Si—N, Si—Cl, Si—H, and Si—C bonds of the silicon-containing layers by using energy of the oxidizing species. Since the bond energy of a Si—O bond is greater than the bond energy of a Si—N, Si—Cl, Si—H, or Si—C bond, Si—N, Si—Cl, Si—H, and Si—C bonds of a silicon-containing layer can be broken by giving energy necessary to form a Si—O bond to the silicon-containing layer which is an oxidizing target. N, H, Cl, and C separated from Si are removed from the layer and are discharged in the form of $N_2$, $H_2$, $Cl_2$, HCl, $CO_2$, etc. In addition, Si remaining after N, H, Cl, and C are separated is coupled with O included in the oxidizing species so that $SiO_2$ layers are formed by changing. It was ascertained that a $SiO_2$ film formed by the film-forming sequence of the current embodiment had very low nitrogen, hydrogen, chlorine, and carbon concentrations and the ratio of Si/O of the $SiO_2$ film was very close to a stoichiometric composition ratio: 0.5. That is, a high-quality $SiO_2$ film could be formed.

The oxidizing treatment of step 3 was compared with an $O_2$ plasma oxidizing treatment and an $O_3$ oxidizing treatment, and it was ascertained that the oxidizing power of the oxidizing treatment of step 3 was greatest under a low temperature atmosphere at 450° C. to 850° C. Specifically, in the range from 400° C. to 850° C., the oxidizing power of the oxidizing treatment of step 3 was greater than the oxidizing power of the $O_3$ oxidizing treatment, and in the range from 450° C. to 850° C., the oxidizing power of the oxidizing treatment of step 3 was greater than the oxidizing power of the $O_3$ oxidizing treatment and the oxidizing power of the $O_2$ plasma oxidizing treatment. By this, it can be understood that the oxidizing treatment of step 3 is significantly effective under such a low temperature atmosphere. Moreover, although a plasma generator is necessary for an $O_2$ plasma oxidizing treatment and an ozonizer is necessary for an $O_3$ oxidizing treatment, the oxidizing treatment of step 3 does not require such devices, and thus it is advantageous in device costs, etc. However, in the current embodiment, $O_3$ or $O_2$ plasma may be used as an oxygen-containing gas. That is, use of such gas is not restricted. An oxidizing species having more energy can be produced by adding a hydrogen-containing gas to $O_3$ or $O_2$ plasma, and effects such as improvement in device characteristics can be obtained by performing an oxidizing treatment using the oxidizing species.

In addition, when a silicon oxide film was formed according to the film-forming sequence of the current embodiment, the rate of film growth and the film thickness uniformity in a surface of a wafer were improved as compared with the case where a silicon oxide film was formed according to a general CVD method. In a general CVD method, inorganic sources such as DCS and $N_2O$ are simultaneously supplied to form a silicon oxide film (higher temperature oxide (HTO) film) by chemical vapor deposition (CVD). In addition, it was ascertained that the impurity concentrations such as nitrogen and chlorine concentrations of a silicon oxide film formed by the film-forming sequence of the current embodiment were much lower than those of a silicon oxide film formed by a general CVD method. In addition, it was ascertained that the impurity concentrations of a silicon oxide film formed by the film-forming sequence of the current embodiment were much lower than those of a silicon oxide film formed by a CVD method using an organic silicon source. In addition, according to the film-forming sequence of the current embodiment, although an organic silicon source was used, the rate of film growth, the film thickness uniformity in a surface of a wafer, and the impurity concentrations of a film were satisfactory.

Other Embodiments of the Present Invention

In the above-described embodiment, $H_2$ gas which is a hydrogen-containing is intermittently supplied as shown in FIG. 4, FIG. 5, and FIG. 6. That is, an explanation has been given on an exemplary case where $H_2$ is supplied only in step 3. However, $H_2$ gas may be continuously supplied. That is, $H_2$ gas may be continuously supplied while step 1 to step 4 are repeated. Alternatively, $H_2$ gas may be intermittently supplied in step 1 and step 3 or in step 1 to step 3. Alternatively, $H_2$ gas may be supplied in step 2 and step 3 or in step 3 and step 4.

In step 1, that is, when HCD gas and DCS gas are supplied, $H_2$ gas may be supplied to extract Cl from the HCD gas and DCS gas and thus to increase the rate of film growth and reduce the Cl impurity concentration of a film. Furthermore, in step 2, that is, after the supplies of HCD gas and DCS gas are stopped, $H_2$ gas may be supplied before $O_2$ gas is supplied, for effectively controlling film thickness uniformity. Furthermore, in step 2, by supplying $H_2$ gas prior to supply of $O_2$ gas, for example, an oxide film may be formed on a part where metal and silicon are exposed in a manner such that the oxide film is selectively formed on the silicon. Furthermore, in step 4, that is, after supply of $O_2$ is stopped but supplies of HCD gas and DCS gas are not started, $H_2$ gas may be supplied to terminate the surface of a SiO layer formed in step 3 with hydrogen so that HCD gas and DCS gas supplied in the next step 1 can be easily adsorbed on the surface of the SiO layer.

In the above-described embodiment, an explanation has been given on an exemplary case of forming a silicon oxide film (SiO film) on a substrate to a predetermined thickness by alternately performing the following processes: a process of forming a silicon-containing layer on the substrate by supplying at least two kinds of source gases containing silicon (HCD gas, DCS gas) to the substrate; and a process of changing the silicon-containing layer into a silicon oxide layer by supplying reaction gases ($O_2$ gas, $H_2$ gas). However, the present invention is not limited to the above-described embodiment but various changes and modifications can be made within the scope and spirit of the present invention.

(Application to Formation of SiN Film)

For example, the present invention can be applied to the case of forming a silicon nitride film on a substrate to a predetermined thickness (formation of SiN film) by changing a silicon-containing layer into a silicon nitride layer instead of changing a silicon-containing layer into a silicon oxide layer. In this case, a nitrogen-containing gas is used as a reaction gas. For example, ammonia ($NH_3$) gas may be used as the nitrogen-containing gas. A film-forming flow for this is different from the film-forming flow of the above-described embodiment only in step 3 and step 4, and the other is the same as that of the film-forming flow of the above-described embodiment. Hereinafter, an explanation will be given on a film-forming sequence in the case where the present invention is applied to formation of a SiN film.

Figure 9:
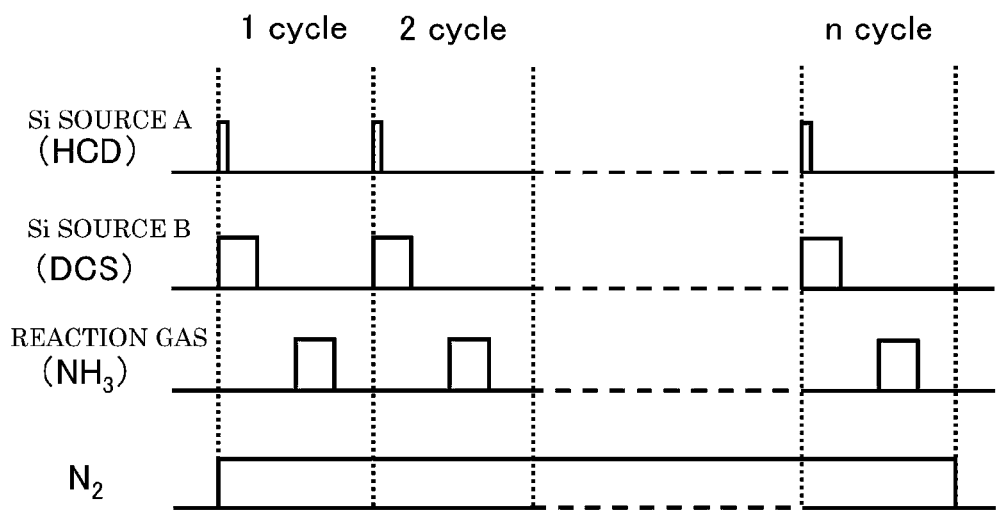
FIG. 9 illustrates exemplary gas supply timing of a film-forming sequence when the present invention is applied to formation of a SiN film, in which HCD gas and DCS gas are simultaneously supplied, and after the supply of HCD gas is first stopped and then the supply of DCS gas is stopped, $NH_3$ gas is supplied.

FIG. 9 illustrates gas supply timing of a film-forming sequence in the case where the present invention is applied to formation of a SiN film. According to a film-forming sequence of the current embodiment, a silicon nitride film is formed on a substrate to a predetermined thickness by alternately performing the following processes: a process of forming a silicon-containing layer on the substrate by supplying at least two kinds of source gases containing silicon, such as a first source gas containing silicon (HCD gas) and a second source gas containing silicon (DCS gas), into the process vessel in which the substrate is accommodated; and a process of changing the silicon-containing layer into a silicon nitride layer by supplying a reaction gas different from the first source gas and the second source gas, such as an nitrogen-containing gas ($NH_3$ gas), into the process vessel. The first source gas is more reactive than the second source gas, and in the process of forming the silicon-containing layer on the substrate, the supply amount of the first source gas is set to be less than the supply amount of the second source gas. Referring to the example shown in FIG. 9, in the process of forming a silicon-containing layer on a substrate, after HCD gas and DCS gas are simultaneously supplied, the supply of HCD gas is first stopped, and only the supply of DCS gas is continued for a predetermined time and then stopped, so as to make the supply time of HCD gas shorter than the supply time of DCS gas. In this case, wafer charging, boat loading, pressure adjustment, temperature adjustment, step 1, step 2, purge, return to atmospheric pressure, boat unloading, and wafer discharging are the same as those of the film-forming flow of the above-described embodiment. Step 3 and step 4 are performed as follows.

[Step 3]

After remaining gas is removed from the inside of process chamber 201, the valve 243$b$ of the second gas supply pipe 232$b$ and the valve 243$d$ of the second inert gas supply pipe 234$b$ are opened to supply $NH_3$ gas through the second gas supply pipe 232$b$ and an inert gas through the second inert gas supply pipe 234$b$. The flow rate of the inert gas flowing through the second inert gas supply pipe 234$b$ is controlled by the mass flow controller 241$d$. The flow rate of the $NH_3$ gas flowing through the second gas supply pipe 232$b$ is controlled by the mass flow controller 241$b$. The $NH_3$ gas and the inert gas that are adjusted in flow rate are mixed with each other in the second gas supply pipe 232$b$. Then, the $NH_3$ gas and the inert gas are supplied through the gas supply holes 248$b$ of the second nozzle 233$b$ into the process chamber 201 which is heated and depressurized and are exhausted through the exhaust pipe 231 ($NH_3$ supply). The $NH_3$ gas is supplied into the process chamber 201 without being activated by plasma.

At this time, the APC valve 242 is properly controlled to keep the inside of the process chamber 201 at a pressure lower than the atmospheric pressure, for example, in the range from 10 Pa to 3,000 Pa. The flow rate of the $NH_3$ gas controlled by the mass flow controller 241$b$ is, for example, in the range of 10 sccm to 10,000 sccm (10 slm). A wafer 200 is exposed to the $NH_3$ gas, for example, for 1 second to 120 seconds. The temperature of the heater 207 is set such that the temperature of the wafer 200 can be kept in the range from 350° C. to 850° C., preferably, in the range from 400° C. to 700° C. Since the reaction temperature of $NH_3$ is high and thus it is difficult to make the $NH_3$ gas reactive at the above-mentioned wafer temperature range, the process chamber 201 is kept at a relatively high pressure as mentioned above so as to activate the $NH_3$ gas by heat. By activating the $NH_3$ gas by heat instead of using plasma and supplying the activated $NH_3$ gas, soft reaction can be caused for soft nitriding (described later).

At this time, gas flowing in the process chamber 201 is $NH_3$ gas which is thermally activated without using plasma, and neither HCD gas nor DCS gas flows in the process chamber 201. Therefore, without causing a vapor-phase reaction, the activated $NH_3$ gas reacts with a silicon-containing layer formed on a wafer 200 in step 1. By this, the silicon-containing layer is nitrided and changed into a silicon nitride layer ($Si_3N_4$ layer, hereinafter referred to as a SiN layer simply).

As a nitrogen-containing gas, not only $NH_3$ gas but also another gas such as $N_2H_4$ gas and $N_3H_8$ gas may be used.

[Step 4]

After the silicon-containing layer is changed into the silicon nitride layer, the valve 243$b$ of the second gas supply pipe 232$b$ is closed to interrupt the supply of $NH_3$ gas. At this time, the APC valve 242 of the exhaust pipe 231 is kept open, and the inside of the process chamber 201 is vacuum-evacuated by using the vacuum pump 246 so as to remove HCD gas and DCS gas remaining in the process chamber 201. At this time, if an inert gas is supplied into the process chamber 201, the remaining $HN_3$ gas can be removed more efficiently (remaining gas removal). At this time, the temperature of the heater 207 is set such that the temperature of the wafer 200 can be in the range from 350° C. to 850° C., preferably, in the range from 400° C. to 700° C. like in the time when $NH_3$ gas is supplied.

The above-described step 1 to step 4 are set as one cycle, and the cycle is performed a plurality of times to form a silicon nitride film ($Si_3N_4$ film, hereinafter referred to as a SiN film simply) on the wafer 200 to a predetermined thickness.

(Application to Formation of SiON Film)

For example, the present invention can be applied to the case of forming a silicon oxynitride film on a substrate to a predetermined thickness (formation of SiON film) by changing a silicon-containing layer into a silicon oxynitride layer instead of changing a silicon-containing layer into a silicon oxide layer. In this case, a nitrogen-containing gas and an oxide-containing gas are used as reaction gases. For example, ammonia ($NH_3$) gas may be used as the nitrogen-containing gas. $O_2$ gas may be used as the oxygen-containing gas. A film-forming flow for this is different from the film-forming flow of the above-described embodiment only in step 3 and step 4, and the other is the same as that of the film-forming flow of the above-described embodiment. Hereinafter, an explanation will be given on a film-forming sequence in the case where the present invention is applied to formation of a SiON film.

Figure 10:
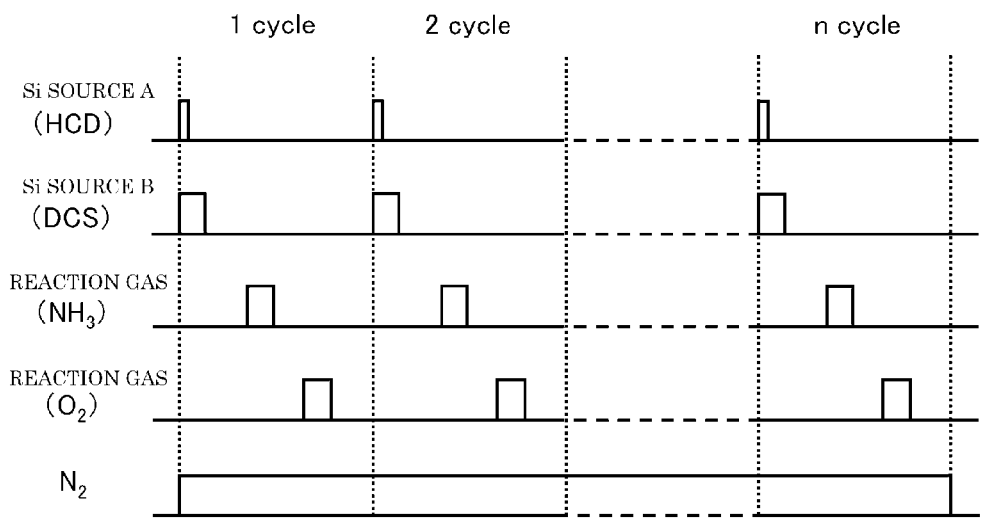
FIG. 10 illustrates exemplary gas supply timing of a film-forming sequence when the present invention is applied to formation of a SiON film, in which HCD gas and DCS gas are simultaneously supplied, and after the supply of HCD gas is first stopped and then the supply of DCS gas is stopped, $NH_3$ gas is supplied and then $O_2$ gas is supplied.

FIG. 10 illustrates gas supply timing of a film-forming sequence in the case where the present invention is applied to formation of a SiON film. According to a film-forming sequence of the current embodiment, a silicon oxynitride film is formed on a substrate to a predetermined thickness by alternately performing the following processes: a process of forming a silicon-containing layer on the substrate by supplying at least two kinds of source gases containing silicon, such as a first source gas containing silicon (HCD gas) and a second source gas containing silicon (DCS gas), into the process vessel in which the substrate is accommodated; a process of changing the silicon-containing layer into a silicon nitride layer by supplying a reaction gas different from the first source gas and the second source gas, such as a nitrogen-containing gas ($NH_3$ gas), into the process vessel; and a process of changing the silicon nitride layer into a silicon oxynitride layer by supplying a reaction gas different from the first source gas and the second source gas, such as an oxygen-containing gas ($O_2$ gas), into the process vessel. The first source gas is more reactive than the second source gas, and in the process of forming the silicon-containing layer on the substrate, the supply amount of the first source gas is set to be less than the supply amount of the second source gas. Referring to the example shown in FIG. 10, in the process of forming a silicon-containing layer on a substrate, after HCD gas and DCS gas are simultaneously supplied, the supply of HCD gas is first stopped, and only the supply of DCS gas is continued for a predetermined time and then stopped, so as to make the supply time of HCD gas shorter than the supply time of DCS gas. In this case, wafer charging, boat loading, pressure adjustment, temperature adjustment, step 1, step 2, purge, return to atmospheric pressure, boat unloading, and wafer discharging are the same as those of the film-forming flow of the above-described embodiment. The following step 3, step 4, step 5, and step 6 are performed instead of the above-described step 3 and step 4.

[Step 3]

Step 3 is performed in the same way as step 3 of the case where the present invention is applied to formation of a SiN film.

[Step 4]

Step 4 is performed in the same way as step 4 of the case where the present invention is applied to formation of a SiN film.

[Step 5]

After remaining gas is removed from the inside of process chamber 201, the valve 243a of the first gas supply pipe 232a and the valve 243c of the first inert gas supply pipe 234a are opened to supply $O_2$ gas through the first gas supply pipe 232a and an inert gas through the first inert gas supply pipe 234a. The flow rate of the inert gas flowing through the first inert gas supply pipe 234a is controlled by the mass flow controller 241c. The flow rate of the $O_2$ gas flowing through the first gas supply pipe 232a is controlled by the mass flow controller 241a. The $O_2$ gas and the inert gas that are adjusted in flow rate are mixed with each other in the first gas supply pipe 232a. Then, the $O_2$ gas and the inert gas are supplied through the gas supply holes 248a of the first nozzle 233a into the process chamber 201 which is heated and depressurized, and the gases are exhausted through the exhaust pipe 231.

At this time, the APC valve 242 is properly controlled to keep the inside of the process chamber 201 at a pressure lower than the atmospheric pressure, for example, in the range from 10 Pa to 1,000 Pa. The flow rate of $O_2$ gas controlled by the mass flow controller 241a is, for example, in the range of 1 sccm to 20,000 sccm (20 slm). A wafer 200 is exposed to the $O_2$ gas, for example, for 1 second to 120 seconds. The temperature of the heater 207 is set such that the temperature of the wafer 200 can be kept in the range from 350° C. to 850° C., preferably, in the range from 400° C. to 700° C. By activating the $O_2$ gas by heat instead of using plasma, the activation amount of the $O_2$ gas can be controlled, and the oxidation amount of a SiN layer can be suppressed for soft reaction.

At this time, gas flowing in the process chamber 201 is $O_2$ gas which is thermally activated without using plasma, and none of HCD gas, DCS gas, and $NH_3$ flows in the process chamber 201. Therefore, without causing a vapor-phase reaction, the activated $O_2$ gas reacts with a SiN layer formed on the wafer 200 in step 3. By this, the SiN layer is oxidized and changed into a silicon oxynitride layer (SiON layer).

As an oxygen-containing gas, not only $O_2$ gas but also another gas such as $O_3$ gas, NO gas, $N_2O_4$ gas, $N_2O$ gas, and $H_2O$ gas may be used. Alternatively, gas obtained by adding a hydrogen-containing gas to an oxygen-containing gas may be used like in step 3 of the above-described embodiment.

[Step 6]

After the SiN layer is changed into a silicon oxynitride layer, the valve 243a of the first gas supply pipe 232a is closed to interrupt the supply of $O_2$ gas. At this time, the APC valve 242 of the exhaust pipe 231 is kept open, and the inside of the process chamber 201 is vacuum-evacuated by using the vacuum pump 246 so as to remove $O_2$ gas remaining in the process chamber 201. At this time, if an inert gas is supplied into the process chamber 201, the remaining $O_2$ gas can be removed more efficiently (remaining gas removal). At this time, the temperature of the heater 207 is set such that the temperature of the wafer 200 can be in the range from 350° C. to 850° C., preferably, in the range from 400° C. to 700° C. like in the time when $O_2$ gas is supplied.

The above-described step 1 to step 6 are set as one cycle, and the cycle is performed a plurality of times to form a silicon oxynitride film on the wafer 200 to a predetermined thickness.

In the above-described application to formation of a SiON film, it has been explained on an exemplary case of forming a silicon oxynitride film on a substrate to a predetermined thickness by alternately performing the following processes: a process (step 1) of forming a silicon-containing layer on the substrate by supplying at least two kinds of source gases containing silicon (HCD gas, DCS gas) to the substrate; a process (step 3) of changing the silicon-containing layer into a silicon nitride layer by supplying a reaction gas ($NH_3$ gas) to the substrate; and a process (step 5) of changing the silicon nitride layer into a silicon oxynitride layer by supplying a reaction gas ($O_2$ gas) to the substrate. However, the order of step 3 (and step 4) and step 5 (and step 6) may be changed. That is, a silicon oxynitride film may be formed on a substrate to a predetermined thickness by alternately performing the following processes: a process (step 1) of forming a silicon-containing layer on the substrate by supplying at least two kinds of source gases containing silicon (HCD gas, DCS gas) to the substrate; a process (step 5) of changing the silicon-containing layer into a silicon oxide layer by supplying a reaction gas ($O_2$ gas) to the substrate; and a process (step 3) of changing the silicon oxide layer into a silicon oxynitride layer by supplying a reaction gas ($NH_3$ gas) to the substrate.

Furthermore, in the above-described embodiment, an explanation has been given on an exemplary case where a first source gas (HCD gas) containing silicon and a second source gas (DCS gas) containing silicon are used as at least two kinds of source gases containing silicon as a predetermined element. However, at least three kinds of source gases containing silicon may be used. For example, a first source gas (HCD gas) containing silicon, a second source gas (DCS gas) containing silicon, and a third source gas ($SiCl_4$ gas, hereinafter referred to as TCS gas) containing silicon may be used. In this case, the first source gas (HCD gas) is more reactive than the second source gas (DCS gas), and the second source gas is more reactive than the third source gas (TCS gas). In a process of forming a silicon-containing layer on a substrate, the supply amount of the first source gas is set to be less than the supply amount of the second source gas and the supply amount of the third source gas. That is, the supply amount of the most reactive source gas is set to be less then the supply amounts of the other source gases. By this, the same effects as those in the above-described embodiments can be obtained.

(Application to Formation of Metal Oxide Film, Metal Nitride Film, or Metal Oxynitride Film)

In the present invention, instead of using a source gas which contains a semiconductor element such as silicon (Si) as a predetermined element, a source gas which contains a metal element such as titanium (Ti), zirconium (Zr), hafnium (Hf), and aluminium (Al) as a predetermined element may be used to form a metal oxide film, a metal nitride film, or a metal oxynitride film on a substrate to a predetermined thickness.

For example, a metal oxide film may be formed on a substrate to a predetermined thickness by alternately performing the following processes: a process of forming a metal-containing layer on the substrate as a layer containing a predetermined element by supplying at least two kinds of source gases containing a metal element as the predetermined element, such as a first source gas containing the metal element and a second source gas containing the metal element, into the process vessel in which the substrate is accommodated; and a process of changing the metal-containing layer into a metal oxide layer by supplying an oxygen-containing gas or both an oxygen-containing gas and a hydrogen-containing gas into the process vessel as a reaction gas(es) different from the first source gas and the second source gas.

For example, a metal nitride film may be formed on a substrate to a predetermined thickness by alternately performing the following processes: a process of forming a metal-containing layer on the substrate as a layer containing a predetermined element by supplying at least two kinds of source gases containing a metal element as the predetermined element, such as a first source gas containing the metal element and a second source gas containing the metal element, into the process vessel in which the substrate is accommodated; and a process of changing the metal-containing layer into a metal nitride layer by supplying a reaction gas different from the first source gas and the second source gas such as a nitrogen-containing gas into the process vessel.

For example, a metal oxynitride film may be formed on a substrate to a predetermined thickness by alternately performing the following processes: a process of forming a metal-containing layer on the substrate as a layer containing a predetermined element by supplying at least two kinds of source gases containing a metal element as the predetermined element, such as a first source gas containing the metal element and a second source gas containing the metal element, into the process vessel in which the substrate is accommodated; a process of changing the metal-containing layer into a metal nitride layer by supplying a reaction gas different from the first source gas and the second source gas such as a nitrogen-containing gas into the process vessel; and a process of changing the metal nitride layer into a metal oxynitride layer by supplying an oxygen-containing gas or both an oxygen-containing gas and a hydrogen-containing gas into the process vessel as a reaction gas(es) different from the first source gas and the second source gas.

In any of the cases, the first source gas is more reactive than the second source gas, and in the process of forming the metal-containing layer on the substrate, the supply amount of the first source gas is set to be less than the supply amount of the second source gas. That is, the supply amount of the first source gas is set to be less than the supply amount of the second source gas by adjusting the supply flow rate of the first source gas less than the supply flow rate of the second source gas, the supply time of the first source gas shorter than the supply time of the second source gas, or the supply flow rate and time of the first source gas less and shorter than the supply flow rate and time of the second source gas.

For example, when a titanium oxide film ($TiO_2$ film), a titanium nitride film (TiN film), or a titanium oxynitride film (TiON film) is formed on a substrate to a predetermined thickness as a metal oxide film, a metal nitride film, or a metal oxynitride film by using a source gas containing titanium as a source gas containing a metal element, TDMAT (tetrakis (dimethylamido)titanium, $Ti[N(CH_3)_2]_4$) gas and $TiCl_4$ (titanium tetrachloride) gas may be used as a first source gas containing titanium and a second source gas containing titanium, respectively. Gases exemplified in the above-described embodiments may be used as an oxygen-containing gas, a hydrogen-containing gas, and a nitrogen-containing gas. In this case, for example, the process temperature (substrate temperature) may be kept at a temperature ranging from 100° C. to 500° C., the process pressure (pressure inside the process chamber) may be kept at a pressure ranging from 1 Pa to 3,000 Pa, the supply flow rate of TDMAT gas may be kept at a value ranging from 1 sccm to 500 sccm, and the supply flow rate of $TiCl_4$ gas may be kept at a value ranging from 1 sccm to 5,000 sccm. The supply flow rates of an oxygen-containing gas, a hydrogen-containing gas, and a nitrogen-containing gas may be kept in the ranges mentioned in the above-described embodiments. TDMAT gas is more reactive than $TiCl_4$ gas. That is, the thermal decomposition temperature of TDMAT gas is lower than that of $TiCl_4$ gas. Therefore, TDMAT gas can be adsorbed on a substrate more easily than $TiCl_4$ gas under the same conditions. In the process of forming a titanium-containing layer on a substrate as a metal-containing layer, the supply amount of TDMAT gas is set to be less than the supply amount of $TiCl_4$ gas.

For example, when a zirconium oxide film ($ZrO_2$ film), a zirconium nitride film (ZrN film), or a zirconium oxynitride film (ZrON film) is formed on a substrate to a predetermined thickness as a metal oxide film, a metal nitride film, or a metal oxynitride film by using a source gas containing zirconium as a source gas containing a metal element, TEMAZ (tetrakis ethyl methyl amino zirconium, $Zr[N(CH_3)(C_2H_5)]_4$) gas and $ZrCl_4$ (zirconium tetrachloride) gas may be used as a first source gas containing zirconium and a second source gas containing zirconium, respectively. Gases exemplified in the above-described embodiments may be used as an oxygen-containing gas, a hydrogen-containing gas, and a nitrogen-containing gas. In this case, for example, the process temperature (substrate temperature) may be kept at a temperature ranging from 100° C. to 400° C., the process pressure (pressure inside the process chamber) may be kept at a pressure ranging from 1 Pa to 1,000 Pa, the supply flow rate of TEMAZ gas may be kept at a value ranging from 1 sccm to 500 sccm, and the supply flow rate of $ZrCl_4$ gas may be kept at a value ranging from 1 sccm to 5,000 sccm. The supply flow rates of an oxygen-containing gas, a hydrogen-containing gas, and a nitrogen-containing gas may be kept in the ranges mentioned in the above-described embodiments. TEMAZ gas is more reactive than $ZrCl_4$ gas. That is, the thermal decomposition temperature of TEMAZ gas is lower than that of $ZrCl_4$ gas. Therefore, TEMAZ gas can be adsorbed on a substrate more easily than $ZrCl_4$ gas under the same conditions. In the process of forming a zirconium-containing layer on a substrate as a metal-containing layer, the supply amount of TEMAZ gas is set to be less than the supply amount of $ZrCl_4$ gas.

For example, when a hafnium oxide film ($HfO_2$ film), a hafnium nitride film (HfN film), or a hafnium oxynitride film (HfON film) is formed on a substrate to a predetermined thickness as a metal oxide film, a metal nitride film, or a metal oxynitride film by using a source gas containing hafnium as a source gas containing a metal element, TEMAH (tetra ethyl methyl amino hafnium, Hf[N(CH$_3$)(C$_2$H$_5$)]$_4$) gas and HfCl$_4$ (hafnium tetrachloride) gas may be used as a first source gas containing hafnium and a second source gas containing hafnium, respectively. Gases exemplified in the above-described embodiments may be used as an oxygen-containing gas, a hydrogen-containing gas, and a nitrogen-containing gas. In this case, for example, the process temperature (substrate temperature) may be kept at a temperature ranging from 100° C. to 400° C., the process pressure (pressure inside the process chamber) may be kept at a pressure ranging from 1 Pa to 1,000 Pa, the supply flow rate of TEMAH gas may be kept at a value ranging from 1 sccm to 500 sccm, and the supply flow rate of HfCl$_4$ gas may be kept at a value ranging from 1 sccm to 5,000 sccm. The supply flow rates of an oxygen-containing gas, a hydrogen-containing gas, and a nitrogen-containing gas may be kept in the ranges mentioned in the above-described embodiments. TEMAH gas is more reactive than HfCl$_4$ gas. That is, the thermal decomposition temperature of TEMAH gas is lower than that of HfCl$_4$ gas. Therefore, TEMAH gas can be adsorbed on a substrate more easily than HfCl$_4$ gas under the same conditions. In the process of forming a hafnium-containing layer on a substrate as a metal-containing layer, the supply amount of TEMAH gas is set to be less than the supply amount of HfCl$_4$ gas.

For example, when an aluminium oxide film (Al$_2$O$_3$ film), an aluminium nitride film (AlN film), or an aluminium oxynitride film (AlON film) is formed on a substrate to a predetermined thickness as a metal oxide film, a metal nitride film, or a metal oxynitride film by using a source gas containing aluminium as a source gas containing a metal element, TMA (trimethylaluminum, Al(CH$_3$)$_3$) gas and AlCl$_3$ (aluminium tetrachloride) gas may be used as a first source gas containing aluminium and a second source gas containing aluminium, respectively. Gases exemplified in the above-described embodiments may be used as an oxygen-containing gas, a hydrogen-containing gas, and a nitrogen-containing gas. In this case, for example, the process temperature (substrate temperature) may be kept at a temperature ranging from 100° C. to 400° C., the process pressure (pressure inside the process chamber) may be kept at a pressure ranging from 1 Pa to 1,000 Pa, the supply flow rate of TMA gas may be kept at a value ranging from 1 sccm to 500 sccm, and the supply flow rate of AlCl$_3$ gas may be kept at a value ranging from 1 sccm to 5,000 sccm. The supply flow rates of an oxygen-containing gas, a hydrogen-containing gas, and a nitrogen-containing gas may be kept in the ranges mentioned in the above-described embodiments. TMA gas is more reactive than AlCl$_3$ gas. That is, the thermal decomposition temperature of TMA gas is lower than that of AlCl$_3$ gas. Therefore, TMA gas can be adsorbed on a substrate more easily than AlCl$_3$ gas under the same conditions. In the process of forming an aluminium-containing layer on a substrate as a metal-containing layer, the supply amount of TMA gas is set to be less than the supply amount of AlCl$_3$ gas.

EXAMPLES

Silicon oxide films were formed on wafers according to the film-forming sequence of the embodiment of FIG. 4, and film growth rates (SiO film growth rates) and film thickness uniformities in surfaces of the wafers (SiO film thickness uniformities) were measured. Except for the flow rates of HCD and DCS, film-forming conditions (process conditions in each step) were set in the process condition ranges described in the previous embodiments. The flow rate of DCS was kept at a value in the range from 1 slm to 2 slm, the flow rate of HCD was varied in the range from 0 slm to 0.2 slm, and the flow rate ratio of HCD/DCS was varied among (A) 0%, (B) 3%, (C) 6%, and (D) 10%. Hereinafter, these will be referred to as a flow rate condition (A), a flow rate condition (B), a flow rate condition (C), and a flow rate condition (D). The HCD/DCS flow rate ratio at the flow rate condition (A) 0% means the case where HCD was not added to DCS (the case where only DCS was supplied). Furthermore, in this example, the supply time of HCD was equal to the supply time of DCS, and thus the flow rate ratio of HCD/DCS was equal to the ratio of the supply amount of HCD gas to the supply amount of DCS gas (HCD/DCS).

Figure 11:
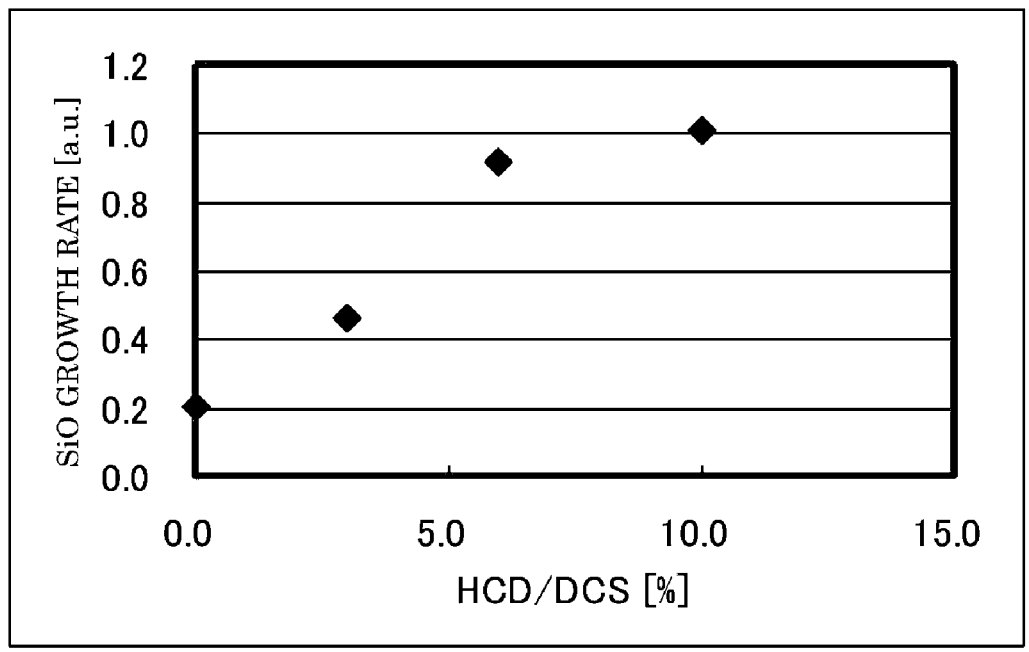
FIG. 11 illustrates a relationship between the supply flow rate ratio of HCD/DCS and the growth rate of SiO in an example of the present invention.
Figure 12:
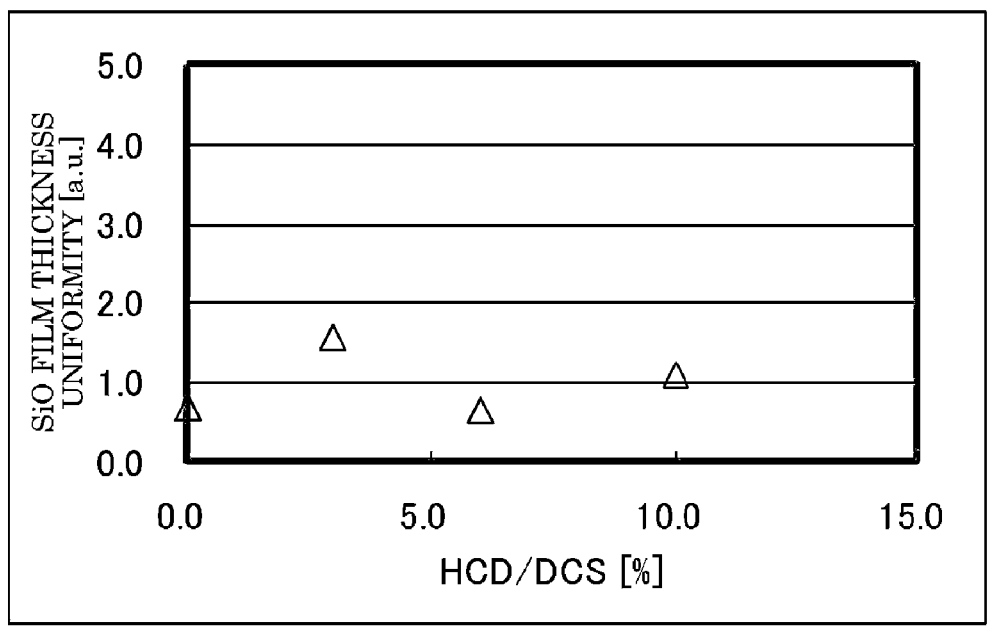
FIG. 12 illustrates a relationship between the supply flow rate ratio of HCD/DCS and the thickness uniformity of SiO in the example of the present invention.

The results are shown in FIG. 11 and FIG. 12. FIG. 11 and FIG. 12 illustrate a relationship between the flow rate ratio of HCD/DCS and the growth rate of SiO and a relationship between the flow rate ratio of HCD/DCS and the thickness uniformity of SiO, respectively. The horizontal axes of FIG. 11 and FIG. 12 denote the flow rate ratio of HCD/DCS (%). The vertical axis of FIG. 11 denotes the growth rate of SiO (arbitrary unit, a.u.), and the vertical axis of FIG. 12 denotes the thickness uniformity of SiO (arbitrary unit, a.u.). FIG. 11 shows a film growth rate ratio, which is obtained by dividing the growth rate of a silicon oxide film by the growth rate of a silicon oxide film formed by supplying HCD alone at a flow rate greater than the flow rate of HCD at the flow rate condition (D). In addition, FIG. 12 shows a film thickness uniformity ratio, which is obtained by dividing the thickness uniformity of a silicon oxide film by the thickness uniformity of a silicon oxide film formed by supplying HCD alone at a flow rate greater than the flow rate of HCD at the flow rate condition (D). The film thickness uniformity denotes the degree of variations of film thickness distribution in a surface of a substrate, and a lower value of the film thickness uniformity denotes a better film thickness uniformity in a surface of a substrate.

Referring to FIG. 11, as the flow rate ratio of HCD/DCS increases, that is, as the amount of HCD added to DCS increases, the film growth rate increases, and when the flow rate ratio of HCD/DCS is 6% or higher, the film growth rate is saturated. The reason for this is considered as follows: in the process conditions of the example, adsorption of DCS and deposition of silicon on a substrate are supplemented by addition of HCD to DCS, and adsorption of DCS and HCD and deposition of silicon on the substrate are saturated when the flow rate ratio of HCD/DCS becomes 6% or higher. If the flow rate ratio of HCD/DCS is set to 3% or higher, adsorption of DCS and HCD and deposition of silicon on a substrate may not be saturated, but the film growth rate may be increased as compared with the case where only DCS is supplied. In addition, referring to FIG. 12, good film thickness uniformity can be obtained at any flow rate conditions. Particularly, if the flow rate ratio of HCD/DCS is 6% or higher, better film thickness uniformity can be obtained. That is, for the film growth rate and film thickness uniformity, it is preferable that the flow rate ratio of HCD/DCS is set to 3% or higher, more preferably, 6% or higher. If the flow rate ratio of HCD/DCS is higher than 50%, there is a potential problem of more byproducts or particles. Furthermore, material costs may be less reduced. Therefore, it is preferable that the flow rate ratio of HCD/DCS is set in the range from 3% to 50%, more preferably, in the range from 6% to 50%. In the above-described example, since the supply time of HCD was equal to the supply time of DCS, the flow rate ratio of HCD/DCS(HCD gas flow rate/DCS gas flow rate) was equal to HCD/DCS (HCD gas supply amount/DCS gas supply amount). That is, in the example, it may be preferable that the ratio of the supply amount of HCD gas to the supply amount of DCS gas (HCD/DCS) is set in the range from 3% to 50%, more preferably, in the range from 6% to 50%.

As described above, according to the method of manufacturing a semiconductor device and the substrate processing apparatus of the present invention, an insulating film can be formed at a high growth rate even at a low temperature, and the thickness of the insulating film can be uniformly maintained with low costs.

<Supplementary Note>

The present invention also includes the following preferred embodiments.

According to an embodiment of the present invention, there is provided a method of manufacturing a semiconductor device, the method including:

loading a substrate into a process vessel;

performing a process to form one of an oxide film, a nitride film and an oxynitride film on the substrate by alternately repeating: (a) forming a layer containing an element on the substrate by supplying a first source gas containing the element and a second source gas containing the element into the process vessel and exhausting the first source gas and the second source gas from the process vessel; and (b) changing the layer containing the element into one of an oxide layer, a nitride layer, and an oxynitride layer by supplying a reaction gas different from the first source gas and the second source gas into the process vessel and exhausting the reaction gas from the process vessel; and unloading the processed substrate from the process vessel, wherein the first source gas is more reactive than the second source gas, and an amount of the first source gas supplied into the process vessel is set to be less than that of the second source gas supplied into the process vessel.

Preferably, a flow rate of the first source gas is set to be lower than that of the second source gas.

Preferably, a supply time of the first source gas is set to be shorter than that of the second source gas.

Preferably, a ratio of an amount of the first source gas supplied into the process vessel to that of the second source gas supplied into the process vessel ranges from 3% to 50%.

Preferably, a ratio of an amount of the first source gas supplied into the process vessel to that of the second source gas supplied into the process vessel ranges from 6% to 50%.

Preferably, a supply of the first source gas is stopped before that of the second source gas is stopped.

Preferably, a supply of the first source gas and a supply of the second source gas are simultaneously started, and the supply of the first source gas is stopped before that of the second source gas is stopped.

Preferably, a supply of the first source gas is started before that of the second source gas is started.

Preferably, a supply of the first source gas is started before that of the second source gas is started, and the supply of the first source is stopped before that of the second source gas is stopped.

Preferably, the element includes one of a semiconductor element and a metal element.

According to another embodiment of the present invention, there is provided a method of manufacturing a semiconductor device, the method including:

loading a substrates into a process vessel;

performing a process to form one of a silicon oxide film, a silicon nitride film and a silicon oxynitride film on the substrate by alternately repeating: (a) forming a silicon-containing layer on the substrate by supplying a first source gas containing a silicon and a second source gas containing the silicon into the process vessel and exhausting the first source gas and the second source gas from the process vessel; and (b) changing the silicon-containing layer into one of a silicon oxide layer, a silicon nitride layer, and a silicon oxynitride layer by supplying a reaction gas different from the first source gas and the second source gas into the process vessel and exhausting the reaction gas from the process vessel; and unloading the processed substrate from the process vessel, wherein the first source gas is more reactive than the second source gas, and an amount of the first source gas supplied into the process vessel is set to be less than that of the second source gas supplied into the process vessel.

Preferably, a flow rate of the first source gas is set to be lower than that of the second source gas.

Preferably, a supply time of the first source gas is set to be shorter than that of the second source gas.

Preferably, a ratio of an amount of the first source gas supplied into the process vessel to that of the second source gas supplied into the process vessel ranges from 3% to 50%.

Preferably, a ratio of an amount of the first source gas supplied into the process vessel to that of the second source gas supplied into the process vessel ranges from 6% to 50%.

Preferably, a supply of the first source gas is stopped before that of the second source gas is stopped.

Preferably, a supply of the first source gas and a supply of the second source gas are simultaneously started, and the supply of the first source gas is stopped before that of the second source gas is stopped.

Preferably, a supply of the first source gas is started before that of the second source gas is started.

Preferably, a supply of the first source gas is started before that of the second source gas is started, and the supply of the first source is stopped before that of the second source gas is stopped.

Preferably, the first source gas includes a hexachlorodisilane gas, and the second source gas includes a dichlorosilane gas.

According to another embodiment of the present invention, there is provided a method of manufacturing a semiconductor device, the method including:

loading a substrates into a process vessel;

performing a process to form one of a silicon oxide film, a silicon nitride film and a silicon oxynitride film on the substrate by alternately repeating: (a) forming a silicon-containing layer on the substrate by supplying a hexachlorodisilane gas and a dichlorosilane gas into the process vessel and exhausting the hexachlorodisilane gas and the dichlorosilane gas from the process vessel; and (b) changing the silicon-containing layer into one of a silicon oxide layer, a silicon nitride layer, and a silicon oxynitride layer by supplying a reaction gas into the process vessel and exhausting the reaction gas from the process vessel; and unloading the processed substrate from the process vessel, wherein an amount of the hexachlorodisilane gas supplied into the process vessel is set to be less than that of the dichlorosilane gas supplied into the process vessel.

According to another embodiment of the present invention, there is provided a substrate processing apparatus including:

a process vessel configured to accommodate a substrate;

a first source gas supply system configured to supply a first source gas containing an element into the process vessel;

a second source gas supply system configured to supply a second source gas containing the element into the process vessel;

a reaction gas supply system configured to supply a reaction gas different from the first source gas and the second source gas into the process vessel;

an exhaust system configured to exhaust an interior of the process vessel; and a control unit configured to control the first source gas supply system, the second source gas supply system, the reaction gas supply system and the exhaust system, so as to form one of an oxide film, a nitride film and an oxynitride film on the substrate by alternately repeating: (a) forming a layer containing the element on the substrate by supplying the first source gas and the second source gas into the process vessel and exhausting the first source gas and the second source gas from the process vessel; and (b) changing the layer containing the element into one of an oxide layer, a nitride layer, and an oxynitride layer by supplying the reaction gas into the process vessel and exhausting the reaction gas from the process vessel, wherein the first source gas is more reactive than the second source gas, and the control unit is configured to control the first source gas supply system and the second source gas supply system so as to set an amount of the first source gas supplied into the process vessel to be less than that of the second source gas supplied into the process vessel.

According to another embodiment of the present invention, there is provided a method of manufacturing a semiconductor device, the method including:

loading a substrates into a process vessel;

performing a process to form one of an oxide film, a nitride film and a oxynitride film on the substrate by alternately repeating: (a) forming a layer containing an element on the substrate by supplying at least two types of source gases containing the element into the process vessel and exhausting the at least two types of source gases from the process vessel; and (b) changing the layer containing the element into one of an oxide layer, a nitride layer, and an oxynitride layer by supplying a reaction gas different from the at least two types of source gases into the process vessel and exhausting the reaction gas from the process vessel; and unloading the processed substrate from the process vessel, wherein an amount of the most reactive source gas of the at least two types of source gases is set to be lower than that of any other of the at least two types of source gases.

Preferably, a flow rate of the most reactive source gas of the at least two types of source gases is set to be lower than that of any other of the at least two types of source gases.

Preferably, a supply time of the most reactive source gas of the at least two types of source gases is set to be lower than that of any other of the at least two types of source gases.

According to another embodiment of the present invention, there is provided a method of manufacturing a semiconductor device, the method including:

loading a substrates into a process vessel;

performing a process to form one of a silicon oxide film, a silicon nitride film and a silicon oxynitride film on the substrate by alternately repeating: (a) forming a silicon-containing layer on the substrate by supplying at least two types of source gases containing a silicon into the process vessel and exhausting the at least two types of source gases from the process vessel; and (b) changing the silicon-containing layer into one of a silicon oxide layer, a silicon nitride layer, and a silicon oxynitride layer by supplying a reaction gas different from the at least two types of source gases into the process vessel and exhausting the reaction gas from the process vessel; and unloading the processed substrate from the process vessel, wherein an amount of the most reactive source gas of the at least two types of source gases is set to be lower than that of any other of the at least two types of source gases.

According to another embodiment of the present invention, there is provided a substrate processing apparatus including:

a process vessel configured to accommodate a substrate;

a source gas supply system configured to supply at least two types of source gases containing an element into the process vessel;

a reaction gas supply system configured to supply a reaction gas different from at least two types of source gases into the process vessel;

an exhaust system configured to exhaust an interior of the process vessel; and a control unit configured to control the source gas supply system, the reaction gas supply system and the exhaust system, so as to form one of an oxide film, a nitride film and an oxynitride film on the substrate by alternately repeating: (a) forming a layer containing the element on the substrate by supplying the at least two types of source gases into the process vessel and exhausting the at least two types of source gases from the process vessel; and (b) changing the layer containing the element into one of an oxide layer, a nitride layer, and an oxynitride layer by supplying a reaction gas different from the at least two types of source gases into the process vessel and exhausting the reaction gas from the process vessel, wherein an amount of the most reactive source gas of the at least two types of source gases is set to be lower than that of any other of the at least two types of source gases.

What is claimed is:

1. A method of manufacturing a semiconductor device, the method comprising:
   loading a substrate into a process vessel;
   performing a process to form a film on the substrate by alternately repeating:
   (a) forming a layer containing an element on the substrate by supplying at least two types of source gases into the process vessel, each of the at least two types of source gases containing the element; and
   (b) changing the layer containing the element into the film by supplying a reaction gas into the process vessel, the reaction gas being different from the at least two types of source gases; and
   unloading the processed substrate from the process vessel.

2. The method of claim 1, wherein the at least two types of source gases have different reactivity, respectively.

3. The method of claim 1, wherein an amount of the most reactive source gas of the at least two types of source gases is set to be lower than that of any other of the at least two types of source gases.

4. The method of claim 1, wherein a flow rate of the most reactive source gas of the at least two types of source gases is set to be lower than that of any other of the at least two types of source gases.

5. The method of claim 1, wherein a supply time of the most reactive source gas of the at least two types of source gases is set to be shorter than that of any other of the at least two types of source gases.

6. The method of claim 1, wherein a supply of the most reactive source gas of the at least two types of source gases is stopped before that of any other of the at least two types of source gases is stopped.

7. The method of claim 1, wherein a supply of the at least two types of source gases are simultaneously started, and a supply of the most reactive source gas of the at least two types of source gases is stopped before that of any other of the at least two types of source gases is stopped.

8. The method of claim 1, wherein a supply of the most reactive source gas of the at least two types of source gases is started before that of any other of the at least two types of source gases is started.

9. The method of claim 1, wherein a supply of the most reactive source gas of the at least two types of source gases is started before that of any other of the at least two types of source gases is started, and the supply of the most reactive source gas of the at least two types of source gases is stopped before that of any other of the at least two types of source gases is stopped.

10. The method of claim 1, wherein after a supply of the most reactive source gas of the at least two types of source gases is stopped, a supply of any other of the at least two types of source gases is started.

11. The method of claim 1, wherein after the most reactive source gas of the at least two types of source gases is supplied into the process vessel, any other of the at least two types of source gases is supplied into the process vessel.

12. The method of claim 1, wherein the film includes one of an oxide film, a nitride film and an oxynitride film.

13. The method of claim 1, wherein the element includes one of a semiconductor element and a metal element.

14. The method of claim 1, wherein the element includes one of Si, Ti, Zr, Hf, and Al.

15. The method of claim 1, wherein the film includes one of a silicon oxide film, a silicon nitride film, a silicon oxynitride film, a metal oxide film, a metal nitride film and a metal oxynitride film.

16. A method of manufacturing a semiconductor device, the method comprising:
    loading a substrate into a process vessel;
    performing a process to form a film on the substrate by alternately repeating:
    (a) supplying at least two types of source gases into the process vessel, each of the at least two types of source gases containing an element; and
    (b) supplying a reaction gas into the process vessel, the reaction gas being different from the at least two types of source gases; and
    unloading the processed substrate from the process vessel.

17. A substrate processing apparatus comprising:
    a process vessel configured to accommodate a substrate;
    a source gas supply system configured to supply at least two types of source gases into the process vessel, each of the at least two types of source gases containing an element;
    a reaction gas supply system configured to supply a reaction gas into the process vessel, the reaction gas being different from the at least two types of source gases; and
    a control unit configured to control the source gas supply system and the reaction gas supply system, so as to form a film on the substrate by alternately repeating:
    (a) forming a layer containing the element on the substrate by supplying the at least two types of source gases into the process vessel; and
    (b) changing the layer containing the element into the film by supplying the reaction gas into the process vessel.

18. A method of manufacturing a semiconductor device, the method comprising:
    loading a substrate into a process vessel;
    performing a process to form a film on the substrate by repeating:
    (a) supplying one of at least two types of source gases into the process vessel, each of the at least two types of source gases containing an element;
    (b) supplying any of the at least two types of source gases other than the one supplied in the step (a) into the process vessel; and
    (c) supplying a reaction gas into the process vessel, the reaction gas being different from the at least two types of source gases; and
    unloading the processed substrate from the process vessel.

19. The method of claim 18, wherein the step (a), the step (b) and the step (c) are performed in order.

* * * * *